(12) United States Patent　(10) Patent No.: US 7,154,922 B2
Hattori　(45) Date of Patent: Dec. 26, 2006

(54) LASER BEAM SOURCE CONTROL METHOD AND UNIT, EXPOSURE METHOD AND APPARATUS, AND DEVICE MANUFACTURING METHOD

(75) Inventor: Osamu Hattori, Kumagaya (JP)

(73) Assignee: Nikon Corporation, Tokyo (JP)

( * ) Notice: Subject to any disclaimer, the term of this patent is extended or adjusted under 35 U.S.C. 154(b) by 83 days.

(21) Appl. No.: 10/464,510

(22) Filed: Jun. 19, 2003

(65) Prior Publication Data

US 2003/0234854 A1　Dec. 25, 2003

(30) Foreign Application Priority Data

Jun. 19, 2002　(JP) ............................. 2002-177894

(51) Int. Cl.
*H01S 3/13*　(2006.01)
(52) U.S. Cl. ..................................... 372/29.01; 372/32
(58) Field of Classification Search ................ 372/9, 372/29.01

See application file for complete search history.

(56) References Cited

U.S. PATENT DOCUMENTS 4,924,257 A　5/1990　Jain
5,825,792 A *　10/1998　Villeneuve et al. ........... 372/32
6,233,263 B1 *　5/2001　Chang-Hasnain et al. .... 372/32
6,317,447 B1　11/2001　Partlo et al. ................... 372/57
6,320,892 B1　11/2001　Padmabandu et al. ......... 372/59
6,392,743 B1　5/2002　Zambon et al. ............... 355/69
6,542,222 B1 *　4/2003　Tsuji et al. .................... 355/67
6,603,533 B1　8/2003　Go
6,806,871 B1 *　10/2004　Yasue .......................... 345/211
6,842,221 B1 *　1/2005　Shiraishi ...................... 355/30

* cited by examiner

*Primary Examiner*—Armando Rodriguez
(74) *Attorney, Agent, or Firm*—Oblon, Spivak, McClelland & Neustadt, P.C.

(57) ABSTRACT

Information of oscillation frequency of a laser beam source in a predetermined range including usable oscillation frequency that takes into consideration an output quality of the laser beam source, such as information on a relationship between oscillation frequency and output quality, is stored in a memory. Then, when the laser beam source is controlled, based on the information stored in the memory, a particular frequency range where the output quality of the laser beam source deteriorates or becomes good is specified, and a decision is made whether or not oscillation frequency f, which is going be used, is within the particular frequency range. Then, according to the results, the oscillation frequency is set, avoiding a frequency range where the output quality deteriorates or within a frequency range where the output quality becomes good according to the result. Thus, a laser beam source whose output quality is always good can be used.

52 Claims, 9 Drawing Sheets

LASER BEAM SOURCE CONTROL METHOD AND UNIT, EXPOSURE METHOD AND APPARATUS, AND DEVICE MANUFACTURING METHOD

BACKGROUND OF THE INVENTION

1. Field of the Invention

The present invention relates to a laser beam source control method and a unit, an exposure method and an apparatus, and a device manufacturing method. More particularly, the invention relates to a laser beam source control method and a laser beam source control unit that control a laser beam source whose oscillation frequency is variable, an exposure method using the laser beam source control method and an exposure apparatus comprising the laser beam source control unit, and a device manufacturing method using the exposure method.

2. Description of the Related Art

Conventionally, exposure apparatuses such as a so-called stepper and a so-called scanning stepper have been used in a photolithographic process for manufacturing a semiconductor device (integrated circuit) or the like.

In recent years, the level of integration in the integrated circuit (semiconductor device) has become extremely increased, and the device rule (practical minimum line width) of an exposure apparatus has become finer accordingly. An excimer laser or a solid-state laser, which has an oscillation line in a far-ultraviolet region and has high brightness and high output, is used as such a light source for ultra-fine lithography.

In a conventional exposure apparatus using such lasers as the light source for exposure, the laser that is the light source has been used in an oscillation frequency band (repetition frequency band) of a fixed or a very narrow range. Further, its maximum frequency has been as low as a few hundred Hz to 1 kHz.

However, higher frequency (higher repetition) of laser oscillation frequency has been urged in recent years due to the request for increasing throughput. Further, high sensitive resist such as a so-called chemically amplified resist has been developed as a resist (photosensitive agent) coated on a substrate such as a wafer, and the quality of the resist has thus diversified. Due to the above-described background, in the recent exposure apparatuses, in order to find the optimum exposure conditions or to minimize laser pulse energy and oscillation pulse frequency, the control system of the exposure apparatus decides the laser oscillation frequency and performs laser oscillation, and a settable oscillation frequency range has also expanded with the higher frequency of laser.

In the exposure apparatus, although the control system of the exposure apparatus decides the laser oscillation frequency to oscillate laser as described above, it has recently been found out that a phenomenon could be observed of the output quality of laser (output energy stability, wavelength stability, and variation characteristic of spectrum line width, for example) deteriorating in a particular oscillation frequency band inherent in laser by the influence of suffering shock wave (acoustic wave) or the like that occurs on laser oscillation. Accordingly, inconvenience that the performance of the exposure apparatus deteriorates could occur when the laser is used in the particular oscillation frequency band. Further, since the laser quality varies due to the oscillation frequency, the laser quality is not stable even in the frequency band other than the above-described particular oscillation frequency band.

SUMMARY OF THE INVENTION

The present invention has been created under such circumstances, and has as its first object to provide a laser beam source control method and a laser beam source control unit, which is capable of using a laser beam source whose output quality is always in a good condition.

The second object of the present invention is to provide an exposure method and an exposure apparatus that can form a pattern on an object with good accuracy.

The third object of the present invention is to provide a device manufacturing method that can improve the productivity of the device.

From the first viewpoint of the present invention, there is provided a laser beam source control method in which a laser beam source whose oscillation frequency is variable is controlled, the method comprising: an obtaining process in which information of oscillation frequency of said laser beam source in a predetermined range including a usable oscillation frequency that takes into consideration an output quality of said laser beam source is obtained; and a controlling process in which an oscillation environment affecting factor that affects an oscillation environment when oscillating the laser beam source is controlled, based on the information obtained.

In this specification, the 'predetermined range including a usable oscillation frequency' includes both cases of a planned frequency range for use of the laser beam source and a case where another frequency range is included in addition to the frequency range for use. Specifically, the 'predetermined range including a usable oscillation frequency' means at least the planned frequency range for use of the laser beam source, that is, the range of oscillation frequency that includes at least the usable oscillation frequency. Furthermore, in this specification, the 'information of oscillation frequency of the laser beam source in a predetermined range including a usable oscillation frequency that takes into consideration an output quality of the laser beam source' may be information of any type; relational expression, table (graph) data, or numerical data themselves.

With this method, the information of the oscillation frequency of the laser beam source in a predetermined range including the usable oscillation frequency that takes into consideration the output quality of the laser beam source is obtained (obtaining process). With this information, the variation status (distribution) of the output quality within the predetermined range (predetermined frequency range) including the usable oscillation frequency, a controlling quantity of a predetermined control factor to change the output quality, or the like can be confirmed. Then, by using the information, the oscillation environment affecting factor that affects the oscillation environment when oscillating the laser beam source, is controlled (controlling process). Herein, the 'oscillation environment affecting factor' means a control factor that affects the output quality. Therefore, according to the present invention, by controlling the oscillation environment affecting factor in the controlling process so that the output quality of the laser beam source becomes good, the laser beam source whose output quality is always good can be used.

In this case, in the obtaining process, information on a relationship between the oscillation frequency and the output quality of the laser beam source can be obtained as the information, and in the controlling process, the oscillation frequency of the laser beam source can be controlled as the oscillation environment affecting factor.

In this case, in the controlling process, an oscillation frequency range where the output quality becomes the best can be specified based on the information, and the oscillation frequency of the laser beam source can be set to an oscillation frequency within the specified oscillation frequency range. Alternatively, in the controlling process, an oscillation frequency range where the output quality deteriorates can be specified based on the information, and the oscillation frequency of the laser beam source can be set to an oscillation frequency out of the specified oscillation frequency range.

In the laser beam source control method of the present invention, in the obtaining process, information on a particular oscillation frequency range where the output quality deteriorates can be obtained as the information, and in the controlling process, the oscillation frequency of the laser beam source can be controlled as the oscillation environment affecting factor, and the oscillation frequency can be set avoiding the particular oscillation frequency range.

In the laser beam source control method of the present invention, in the obtaining process, information on a particular oscillation frequency range where the output quality becomes the best can be obtained as the information, and in the controlling process, the oscillation frequency of the laser beam source can be controlled as the oscillation environment affecting factor, and the oscillation frequency can be set to an oscillation frequency within the particular oscillation frequency range.

In the laser beam source control method of the present invention, in the obtaining process, information on a relationship between the oscillation frequency, the output quality, and a predetermined control factor other than the oscillation frequency related to oscillation of the laser beam source can be obtained as the information, and in the controlling process, the predetermined control factor can be controlled as the oscillation environment affecting factor so as to change a relationship between the oscillation frequency and the output quality. Herein, the 'predetermined control factor' includes at least a control factor that changes the relationship between the oscillation frequency and the output quality of the laser beam source, that is, the variation status (distribution) of the output quality with respect to the oscillation frequency.

In this case, in the controlling process, the relationship between the oscillation frequency and the output quality can be changed by controlling the control factor so that an oscillation frequency range where the output quality deteriorates goes off from the oscillation frequency range to be used. Alternatively, in the controlling process, the relationship between the oscillation frequency and the output quality can be changed by controlling the control factor so that an oscillation frequency range of the laser beam source whose output quality is most stable matches a desired frequency.

In the laser beam source control method of the present invention, when information on a relationship between the oscillation frequency, the output quality, and a predetermined control factor other than the oscillation frequency related to oscillation of the laser beam source is obtained as the information, in the controlling process, the oscillation frequency of the laser beam source can be set to an oscillation frequency out of the oscillation frequency range where the output quality deteriorates, after the predetermined control factor is controlled.

In the laser beam source control method of the present invention, the control factor can include at least either one of flow velocity and temperature of gas inside the laser beam source.

In the laser beam source control method of the present invention, the output quality can include at least one of energy stability, wavelength stability, and variation characteristics of spectrum line width of laser beam generated from the laser beam source.

From the second viewpoint of the present invention, there is provided an exposure method in which a mask is illuminated using a laser beam generated from a laser beam source and a pattern formed on the mask is transferred onto an object, wherein as the laser beam, a laser beam generated from the laser beam source controlled by the laser beam source control method according to the present invention is used.

With this method, since the mask is illuminated by the laser beam, which is generated from the laser beam source controlled by using the laser beam source control method of the present invention and the pattern formed on the mask is transferred onto the object, exposure (transfer of mask pattern onto body) can be performed in a state where the output quality of the laser beam source is always good, and thereby the pattern can be formed on the object with good accuracy.

From the third viewpoint of the present invention, there is provided a laser beam source control unit that controls a laser beam source whose oscillation frequency is variable, the device comprising: a storage unit that stores information on oscillation frequency of the laser beam source in a predetermined range including a usable oscillation frequency that takes into consideration an output quality of the laser beam source; and a control unit that controls an oscillation environment affecting factor that affects oscillation environment when oscillating the laser beam source, based on the information stored in the storage unit.

With this laser beam source control unit, in the storage unit, the information of the oscillation frequency of the laser beam source in a predetermined range including the usable oscillation frequency that takes into consideration the output quality of the laser beam source is stored. With this information, the variation status (distribution) of the output quality within the predetermined range (predetermined frequency range) including the usable oscillation frequency, a controlling quantity of a predetermined control factor to change the output quality, or the like can be confirmed. Then, by using the information, the oscillation environment affecting factor that affects the oscillation environment when oscillating the laser beam source is controlled (controlling process), based on the information stored in the storage device. Herein, the 'oscillation environment affecting factor' means a control factor that affects the output quality. Therefore, according to the present invention, when the control unit controls the oscillation environment affecting factor so that the output quality of the laser beam source becomes good, the laser beam source whose output quality is always good can be used.

In this case, the oscillation environment affecting factor can include the oscillation frequency of the laser beam source.

In this case, the storage unit can store information on a relationship between the oscillation frequency and the output quality of the laser beam source, and the control unit can control the oscillation frequency of the laser beam source. Alternatively, the storage unit can store information on a particular oscillation frequency range where the output quality deteriorates, and the control unit can set the oscillation frequency of the laser beam source avoiding the particular oscillation frequency range. Still alternatively, the storage unit can store information on a particular oscillation frequency range where the output quality becomes the best, and the control unit can set the oscillation frequency of the laser beam source to an oscillation frequency within the particular oscillation frequency range.

In addition, in the laser beam source control unit of the present invention, the storage unit can store information on a relationship between the oscillation frequency, the output quality, and a predetermined control factor other than the oscillation frequency related to oscillation of the laser beam source, and the control unit can control the predetermined control factor as the oscillation environment affecting factor so as to change a relationship between the oscillation frequency and the output quality. Herein, the 'predetermined control factor' includes at least the control factor that changes the relationship between the oscillation frequency and the output quality of the laser beam source, that is, the variation status (distribution) of the output quality with respect to the oscillation frequency.

In this case, the control factor can include at least either one of flow velocity and temperature of gas inside the laser beam source.

In this case, the control unit can change the relationship between the oscillation frequency and the output quality so that an oscillation frequency range where the output quality deteriorates goes off from the oscillation frequency range to be used, by controlling the control factor. Alternatively, the control unit can change the relationship between the oscillation frequency and the output quality so that an oscillation frequency range of the laser beam source whose output quality is most stable matches a desired frequency, by controlling the control factor.

In the laser beam source control apparatus of the present invention, when the storage unit stores information on a relationship between the oscillation frequency, the output quality, and a predetermined control factor other than the oscillation frequency related to oscillation of the laser beam source, the control unit can set the oscillation frequency of the laser beam source to an oscillation frequency out of the oscillation frequency range where the output quality deteriorates, after controlling the predetermined control factor.

In the laser beam source control apparatus of the present invention, the output quality can include at least one of energy stability, wavelength stability, and variation characteristics of spectrum line width of the laser beam generated from the laser beam source.

From the fourth viewpoint of the present invention, there is provided an exposure apparatus that uses a laser beam generated from a laser beam source to illuminate a mask to transfer a pattern formed on the mask onto an object, the exposure apparatus comprising: the laser beam source control unit according to the present invention; and a projection optical system that projects an image of a pattern on the mask illuminated by the laser beam that generated from the laser beam source controlled by the laser beam source control unit onto the object.

With this apparatus, the mask is illuminated by the laser beam generated from the laser beam source controlled by the laser beam source unit of the present invention, and the pattern image on the mask is transferred onto the object by the projection optical system. Thus, exposure (transfer of the mask pattern onto the object) can be performed in a state where the output quality of the laser beam source is always good, and thereby the pattern can be formed on the object with good accuracy.

Further, in the lithographic process, the pattern can be formed on the object with good accuracy by transferring a device pattern formed on the mask onto the object by using the exposure method of the present invention, and thereby a highly integrated microdevice can be manufactured with good yield. Similarly, in the lithographic process, the pattern can be formed on the object with good accuracy by transferring a device pattern formed on the mask onto the object by using the exposure apparatus of the present invention, and thereby a highly integrated microdevice can be manufactured with good yield. Accordingly, from another viewpoint of the present invention, there is provided a device manufacturing method using the exposure method or the exposure apparatus of the present invention.

BRIEF DESCRIPTION OF THE DRAWINGS

In the accompanying drawings.

DETAILED DESCRIPTION OF THE PREFERRED EMBODIMENTS

First Embodiment

A first embodiment of the present invention will be described based on FIGS. 1 to 5 as follows.

Figure 1:
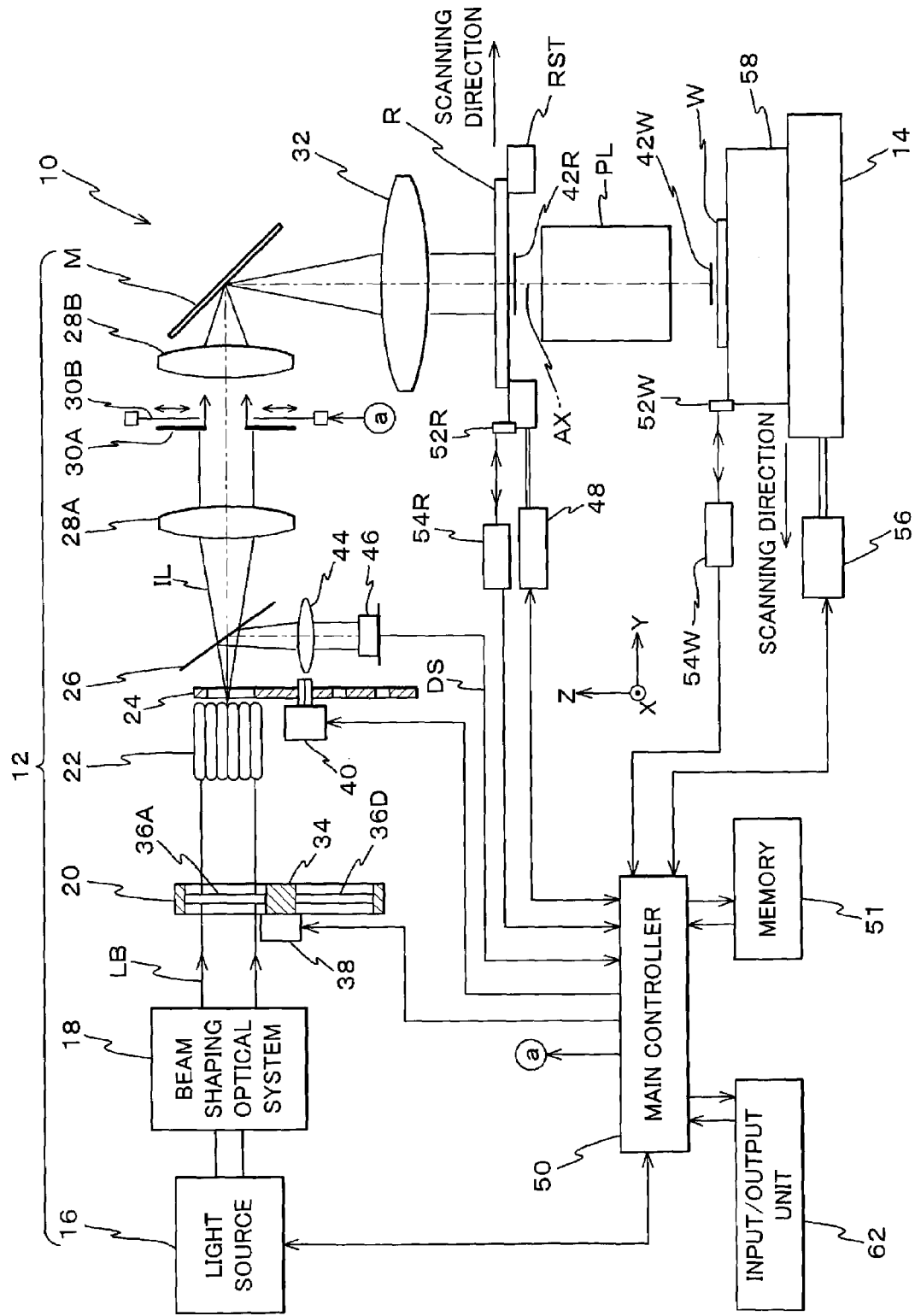
FIG. 1 is a view schematically showing a configuration of an exposure apparatus according to a first embodiment of the present invention.

FIG. 1 shows the schematic configuration of an exposure apparatus 10 according to the first embodiment. The exposure apparatus 10 is a scanning exposure apparatus of the step-and-scan method, which uses a laser beam source as the exposure light source.

The exposure apparatus 10 comprises an illumination system 12 including a laser beam source 16, a reticle stage RST as a mask stage that holds a reticle R as a mask illuminated by the illumination system 12 and moves it in a predetermined scanning direction, a projection optical system PL that projects the pattern of the reticle R on a wafer W as an object, an XY stage 14 that holds the wafer W and moves on a horizontal plane (within an XY plane), and the control system of these parts.

The illumination system 12 comprises the laser beam source 16, a beam shaping optical system 18, a rough energy adjuster 20, an optical integrator (which is a fly-eye lens, an internal reflection type integrator, or diffraction optical device, and is also referred to as the 'fly-eye lens' hereinafter because the fly-eye lens is used in FIG. 1) 22, an illumination system aperture stop plate 24, a beam splitter 26, a first relay lens 28A, a second relay lens 28B, a fixed reticle blind 30A, a movable reticle blind 30B, an optical path bending mirror M, a condenser lens 32, and the like. Note that components other than the laser beam source 16, which constitute the illumination system 12, are collectively called an 'illumination optical system' accordingly.

Herein, description will be given for each of the above-described component sections of the illumination optical system 12. It is assumed that a KrF excimer laser (oscillation frequency 248 nm) is used as the laser beam source 16, as an example. In the following, the laser beam source 16 is also called a 'light source unit 16'.

As laser beam source 16, instead of the KrF excimer laser, a metal vapor laser, a YAG laser, or a pulse light source such as a harmonic generator of a semiconductor laser can also be used, not to mention an KrF excimer laser (oscillation frequency 193 nm) and an $F_2$ laser (oscillation frequency 157 nm).

Figure 2:
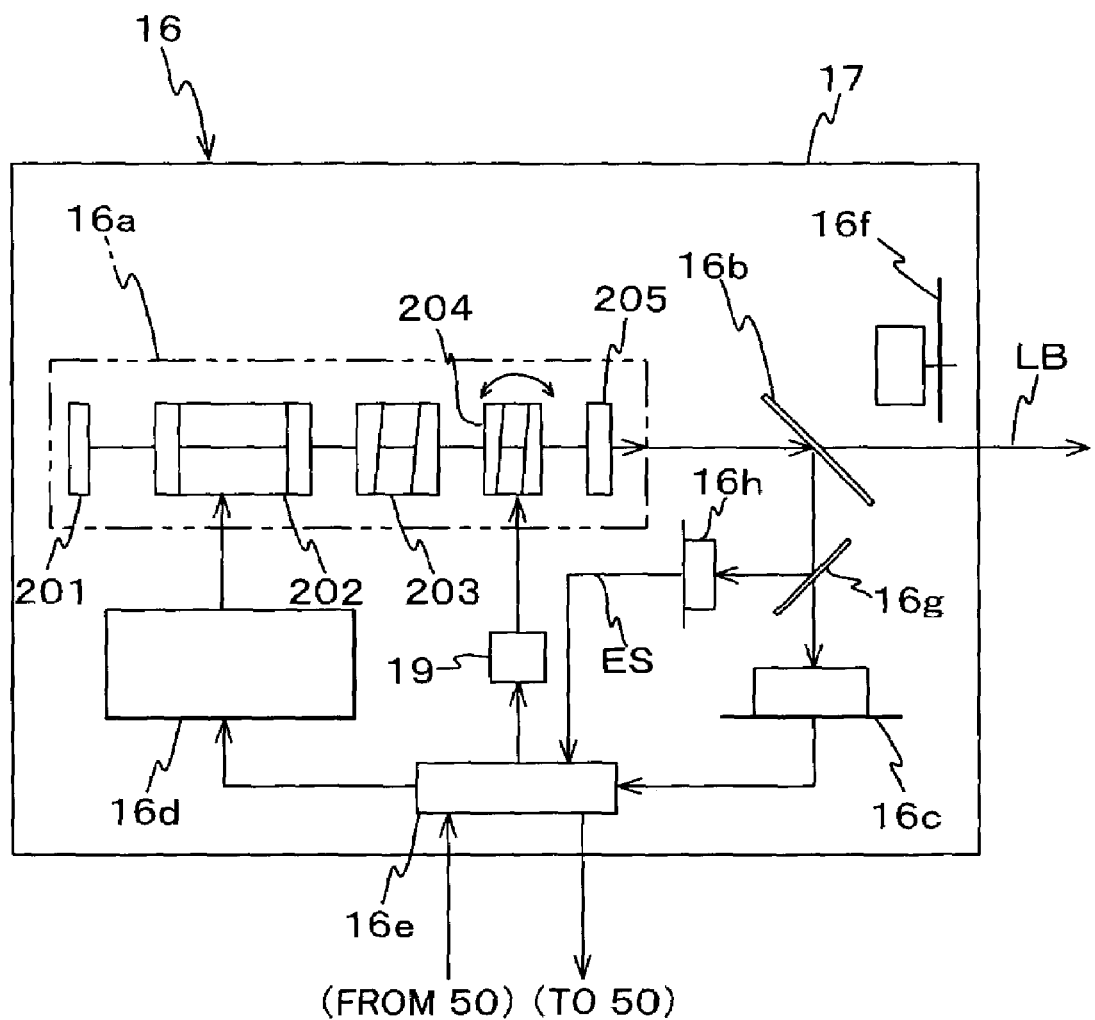
FIG. 2 is a block diagram schematically showing an example of an internal configuration of a light source unit of FIG. 1.

The light source unit 16 comprises, as shown in FIG. 2, a laser resonator 16a as a laser unit, a beam splitter 16b having the transmittance of approximately 97%, which is arranged on the optical path of a laser beam LB irradiated from the laser resonator 16a, a half mirror (or beam splitter) 16g and a beam monitoring mechanism 16c, which are sequentially arranged on the reflected optical path of the beam splitter 16b, an energy monitor 16h arranged on the reflected optical path of the half mirror 16g, a laser controller 16e to which the output signals from both the beam monitoring mechanism 16c and the energy monitor 16h are input, a laser power source section 16d whose power source voltage or the like is controlled by laser controller 16e, and so on. As shown in FIG. 2, each component (such as 16a to 16e, 16g, 16h) of the light source unit 16 is housed in a housing 17. The laser beam LB irradiated from the laser resonator 16a having passed through the beam splitter 16b is made incident on the illumination optical system via a light transmission section of the housing 17.

Note that it is possible to arrange either one of the laser controller 16e and the laser power source section 16d or the both outside the housing 17.

The laser resonator 16a is constituted by including an excimer laser tube (laser chamber) 202 including a discharge electrode, a total reflection mirror (rear mirror) 201 arranged on the rear side (left side of document in FIG. 2) of the excimer laser tube 202, a low reflectivity mirror (front mirror) 205 arranged on the front side (right side of document in FIG. 2) of the excimer laser tube 202, a fixed Fabry-Perot etalon 203 and a Fabry-Perot etalon 204 of variable inclination, which are sequentially arranged between the excimer laser tube 202 and the front mirror 205, and the like.

In this case, the rear mirror 201 and the front mirror 205 constitute the resonator, which is designed to increase coherency by a small amount.

Further, the Fabry-Perot etalon (referred to as 'etalon' hereinafter) 203 and the etalon 204 constitute a narrowbanding module. More specifically, the etalons (203, 204) are two pieces of quartz glass, which are parallelly opposed to each other with a predetermined air gap between them, and serve as a band pass filter. Out of the etalons (203, 204), the etalon 203 is for rough adjustment and the etalon 204 is for fine adjustment. Herein, the etalons (203, 204) outputs the laser beam after narrowing the spectrum width of the laser beam LB irradiated from the laser resonator 16a to approximately 1/100 to 1/300 of a natural oscillation spectrum width. Further, by adjusting the inclination of the etalon 204, the wavelength (center wavelength) of the laser beam LB irradiated from the laser resonator 16a can be shifted within a predetermined range.

In addition, for example, the laser resonator may be constituted so that in the laser resonator 16a of FIG. 2, the etalon 203 for rough adjustment is removed and a reflective diffraction grating as a wavelength selecting device is provided in an inclinable manner, instead of the rear mirror 201. In this case, the grating and the front mirror 205 constitute the resonator. Furthermore, the grating and the etalon 204 for fine adjustment constitute a narrowbanding module having the similar function described above. In this case, the grating is used for rough adjustment in setting wavelength and the etalon 204 is used for fine adjustment. If the inclination of either the etalon 204 or the grating is changed, the wavelength (oscillation frequency) of the laser beam LB irradiated from the laser resonator can be changed within a predetermined range.

Note that it is possible to constitute the narrowbanding module by the combination of a prism and a diffraction grating (grating), for example. In this case, the laser resonator may be constituted so that in the laser resonator 16a of FIG. 2, the etalon 203 and the etalon 204 are removed or only the etalon 203 is removed, the reflective diffraction grating is provided instead of the rear mirror 201, and the prism is provided between the diffraction grating and the excimer laser tube 202.

Laser gas (which consists of krypton Kr and fluorine $F_2$, which are medium gas, and helium He that is buffer gas) of a predetermined concentration ratio is filled in the excimer laser tube 202. An exhaust pipe made up of flexible tube, for example, is connected to the excimer laser tube 202 via an exhaust valve (not shown). The exhaust pipe is provided with a detoxifying filter that traps fluorine, an exhaust pump, and the like. These are provided in consideration of the toxicity of fluorine, where the detoxifying filter safens the exhaust gas and the exhaust pump exhausts it outside the unit.

Furthermore, one end of a flexible gas supply pipe is connected to the excimer laser tube 202 via an intake valve (not shown), and the other end of the gas supply pipe is connected to a gas container (not shown) of Kr, $F_2$, He or the like.

The main controller 50 in FIG. 1 controls open/close of each of the valves. The main controller 50 adjusts the laser gas in the excimer laser tube 202 to a predetermined concentration ratio and a predetermined pressure at the time of exchanging gas, for example. Further, a fan (not shown) constantly circulates the laser gas inside the excimer laser tube 202 at the time during laser oscillation.

Incidentally, since the excimer laser tube 202 is a discharge section, its temperature becomes extremely high. For this reason, the excimer laser tube 202 is thermally isolated sufficiently from peripheral sections and its temperature is controlled to a constant temperature by a cooling medium such as water, in this embodiment. Specifically, a coolant pipe (not shown) is disposed around the excimer laser tube 202, and the coolant pipe is also connected to the outside via the flexible tube (not shown). An external cooling unit supplies water or other cooling medium into the coolant pipe in a circulating manner, and the control system of the cooling unit controls the temperature of the cooling medium. Moreover, a heat source such as a heater (not shown) is arranged in the excimer laser tube 202, in this embodiment.

The main controller 50 is constituted capable of controlling the temperature of gas in the excimer laser tube 202 if necessary, by controlling the control system of the cooling unit and the heater.

By adjusting the temperature of the gas in the excimer laser tube 202, the flow velocity of the laser gas during laser oscillation can be controlled. Of course, the flow velocity of the laser gas can be controlled as well by controlling the number of rotation of the above-described fan.

The energy monitor 16h receives reflected light from the half mirror 16g arranged on the optical path of the reflected light reflected by the beam splitter 16b, and outputs its photoelectric conversion signals (light intensity signals) as an output signal ES to the laser controller 16e. As the energy monitor 16h, a photo-detecting device such as a PIN type photo diode having high response frequency to detect pulse emission in a far-ultraviolet region is used, for example.

As the beam monitoring mechanism 16c, a Fabry-Perot interferometer is used, which includes the condenser lens, a collimator lens, the etalon, a telemeter lens, a line sensor, and the like, which are sequentially arranged on the transmission optical path of the half mirror 16g, for example. In this case, two pieces of a partially reflective mirror (quartz glass), which are arranged by opposing to each other with a predetermined air gap between them, are used as the etalon as described above. Now, when the laser beam LB is made incident on the etalon, diffraction light (a secondary wave by Huygens' principle) at a partial reflection plane repeats reflection and transmission in the air gap. At this point, only the beam in the direction of an incident angle $\theta$, which satisfies the following expression (1), passes through the etalon and is intensified, and thereby a fringe pattern is formed on the focal plane of the telemeter lens. Thus, the line sensor arranged on the focal plane of the telemeter lens detects the fringe pattern.

$$2nd \cos \theta = m\lambda \quad (1)$$

In the above expression, reference codes d, n and m denote the air gap, the refraction index of the air gap, and an order, respectively.

The above expression (1) reveals that the fringe pattern formed on the focal plane varies due to the difference of the wavelength $\lambda$ if n, d and m are constant.

In the distribution of light intensity detected by the line sensor arranged on the focal plane of the telemeter lens, a bell curve corresponding to the fringe pattern appears at a predetermined interval regarding the longitudinal direction of the line sensor on the focal plane. The width of a portion equivalent to ½ of the bell curve height of each light intensity distribution corresponds to the spectrum line width (Full Width at Half Maximum (FWHM)) of the laser beam LB. Further, the position in the longitudinal direction of the line sensor corresponding to the bell curve peak of each light intensity distribution is fixed, according to the center wavelength. Specifically, the fringe pattern corresponds to the center wavelength and the spectrum line width (FWHM) of the incident light, and the beam monitoring mechanism 16c outputs the imaging signals of the fringe pattern to the laser controller 16e.

The laser power source section 16d is constituted including a high voltage power source, a pulse compression circuit (switching circuit) that makes the discharge electrode (not shown) in the excimer laser tube 202 discharge at a predetermined timing, using the high voltage power source, and the like.

The laser controller 16e is constituted including an image processing circuit (which includes an AD converter, a peak holding circuit, or the like) that applies a predetermined signal processing to the imaging signal of the above-described fringe pattern and the output signal ES, a micro computer that performs a predetermined arithmetical operation, and the like. The laser controller 16e is designed to obtain information regarding the optical characteristic of the incident light (laser beam) LB to the beam monitoring mechanism 16c, such as the center wavelength (or centroidal wavelength) $\lambda$ and the spectrum line width (FWHM), by applying the predetermined signal processing to the imaging signal of the fringe pattern.

By using the center wavelength $\lambda$ of the laser beam LB, the laser controller 16e performs arithmetic operation for a shift quantity of the center wavelength (wavelength shift quantity) $\Delta\lambda$ to a set wavelength $\lambda_0$ set by the main controller 50, based on the following expression (2).

$$\Delta\lambda = |\lambda_0 - \lambda| \quad (2)$$

Furthermore, the laser controller 16e performs arithmetic operation for the variation quantity of the spectrum line width based on the difference between the spectrum line width and the reference value of the spectrum line width, which is, for example, an initial spectrum line width.

Moreover, in this embodiment, the light source unit 16 is provided with a drive mechanism 19 for dispersion elements such as the etalon 204 that constitutes the laser resonator 16a (or grating and etalon 204, or grating or prism) (refer to FIG. 2). Then, the laser controller 16e controls the drive mechanism 19 based on the above-described wavelength shift quantity $\Delta\lambda$, and thus the center wavelength $\lambda$ is controlled within a desired range.

In addition, at the time of regular exposure, the laser controller 16e performs feedback control of the power source voltage in the high voltage power source inside the laser power source 16d based on the energy power detected from the output ES of the energy monitor 16h such that energy per pulse of the laser beam LB output from the laser resonator 16a becomes a value corresponding to a target value of energy per pulse, which is given by control information from the main controller 50.

Still further, the laser controller 16e also controls the pulse number or repetition frequency (oscillation frequency) of pulse oscillation during exposure of one shot region on the wafer W, by controlling application timing or application interval of a trigger signal to the pulse compression circuit inside the laser power source 16d based on the control information from the main controller 50.

Additionally, on the illumination optical system side of the beam splitter 16b in the housing 17 of the light source unit 16, a shutter 16f is arranged as well to block the laser beam LB according to the control information from the main controller 50.

Returning to FIG. 1, the beam shaping optical system 18 shapes the cross-sectional shape of the laser beam LB, which is a pulsed laser that has been emitted from the excimer laser 16, such that the beam is made incident efficiently to the fly-eye lens 22 provided in the rear of the optical path of the laser beam LB, which consists of a cylinder lens, a beam expander (both are not shown), or the like.

The rough energy adjuster 20 is arranged on the optical path of the laser beam LB in the rear of the beam shaping optical system 18. In this case, a plurality (six, for example) of ND filters (FIG. 1 shows two ND filters (36A, 36D)) having different transmittance (=1−attenuation rate) are arranged around a rotating plate 34, and a drive motor 38 rotates the rotating plate 34 so that the transmittance to the incident laser beam LB can be switched in plural steps from 100% in geometric progression. The drive motor 38 is controlled by the main controller 50.

The fly-eye lens 22 is arranged on the optical path of the laser beam LB in the rear of the rough energy adjuster 20, and forms a plane light source that consists of a large number of point light sources on the focal plane of its outgoing side, that is, a secondary light source, in order to illuminate the reticle R with uniform illumination distribution. The laser beam irradiated from the secondary light source will be referred to as 'pulse illumination light IL' hereinafter.

The illumination system aperture stop plate 24 made up of a disk-shaped member is arranged near the outgoing plane, that is, on the focal plane of its outgoing side that substantially matches the pupil plane of the illumination optical system, in this embodiment. On the illumination system aperture stop plate 24, for example, an aperture stop made up of a regular circular aperture, an aperture stop made up of a small circular aperture to minimize σ value that is a coherence factor, a ring-shaped aperture for ring-shaped illumination, a modified aperture stop in which a plurality of apertures are arranged in a decentered manner for the use of a modified light source method (only two kinds of aperture stop are shown in FIG. 1), and the like are arranged in a substantially equiangular distance. A drive unit 40 such as a motor controlled by the main controller 50 (described later) rotates the illumination system aperture stop plate 24, by which any aperture stop is selectively set on the optical path of the pulse illumination light IL. Note that, instead of or in combination of the aperture stop plate 24, an optical unit, which includes at least one of a plurality of diffraction optical devices arranged in the illumination optical system that can be switched therein, a prism (such as cone prism and polyhedral prism) movable along the optical axis of the illumination optical system, and a zoom optical system, may be arranged between the light source 16 and the optical integrator 22. Then, by making the intensity distribution of the illumination light on the incident plane of the optical integrator 22 variable when the optical integrator 22 is a fly-eye lens, or by making the incident angle range or the like of the illumination light to the incident plane of the optical integrator 22 variable when the optical integrator 22 is an internal reflection type integrator, the light quantity distribution (size and shape of secondary light source), that is, light quantity loss with the change of illumination conditions is preferably suppressed.

The beam splitter 26 having small reflectivity and large transmittance is arranged on the optical path of the pulse illumination light IL in the rear of the illumination system aperture stop plate 24, and a relay optical system, which is made up of the first relay lens 28A and the second relay lens 28B with the fixed reticle blind 30A and the movable reticle blind 30B interposed between the lenses (28A, 28B), is further arranged in the rear of the beam splitter.

The fixed reticle blind 30A is arranged on a plane slightly defocused from a conjugate plane against the pattern plane of the reticle R, and a rectangular aperture that sets an illumination area 42R on the reticle R is formed on the blind. The movable reticle blind 30B having an aperture section, whose position and width corresponding to a scanning direction are variable, is arranged near the fixed reticle blind 30A, and the illumination area 42R is further limited via the movable reticle blind 30B at the starting time and the ending time of scanning exposure, thus exposure to an unnecessary area is prevented.

The bending mirror M, which reflects the pulse illumination light IL having passed the second relay lens 28B toward the reticle R, is arranged on the optical path of the pulse illumination light IL in the rear of the second relay lens 28B that constitutes the relay optical system, and the condenser lens 32 is arranged on the optical path of the pulse illumination light IL in the rear of the mirror M.

On the other hand, an integrator sensor 46 that consists of a photoelectric conversion device receives the pulse illumination light IL reflected by the beam splitter 26 via a condenser lens 44, and the photoelectric conversion signals of the integrator sensor 46 is supplied as an output DS (digit/pulse) to the main controller 50 via the peak holding circuit and an A/D converter (not shown). As the integrator sensor 46, the PIN type photodiode or the like having sensitivity within the far-ultraviolet region and high response frequency to detect the pulse emission of the light source unit 16 can be used. Correlation coefficient (or correlation function) between the output DS of the integrator sensor 46 and the illumination (intensity) of the pulse illumination light IL on the surface of the wafer W is obtained in advance, and stored in a memory 51 provided beside the main controller 50. Further, the correlation coefficient (or correlation function) between the output ES of the above-described energy monitor 16h and the output DS of the integrator sensor 46 is obtained in advance, and stored in the memory 51.

The reticle R is mounted on the reticle stage RST, and held by suction via a vacuum chuck (not shown) or the like. The reticle stage RST can be finely driven within the horizontal plane (XY plane), and is scanned by a reticle stage drive section 48 in a scanning direction (Y-axis direction that is the right/left direction of the document in FIG. 1 in this case) within a predetermined stroke range. The position of the reticle stage RST during scanning is measured by an external laser interferometer 54R via a moving mirror 52R fixed on the reticle stage RST, and the measurement value of the laser interferometer 54R is to be supplied to the main controller 50. Note that mirror processing may be performed to the end surface of the reticle stage RST to form a reflection plane for the laser interferometer 54R (equivalent to the reflection plane of the above-described moving mirror 52R).

As the projection optical system PL, for example, a reduction system of double telecentricity, which is a refraction system made up of plural pieces of lens element having an optical axis AX of a common Z-axis direction, is used. Further, the projection magnification δ of the projection optical system PL is, for example, ¼ or ⅕. Accordingly, when the pulse illumination light IL illuminates the illumination area 42R on the reticle R as described above, an image obtained by reducing the pattern formed on the reticle R by the projection magnification δ via the projection optical system PL is formed on a slit-shaped exposure area (area conjugate to illumination area 42R) 42W on the wafer W on which the resist (photosensitive agent) has been coated.

A wafer stage drive section 56 is designed to drive the XY stage 14 two-dimensionally in the Y-axis direction that is the scanning direction and an X-axis direction orthogonal thereto (orthogonal direction to the document surface in FIG. 1) within the XY plane. A Z-tilt stage 58 is mounted on the XY stage 14, and the wafer W is held by vacuum chuck or the like via a wafer holder (not shown). The Z-tilt stage 58 has a function to adjust the position of the wafer W in a Z-axis direction (focus direction) and to adjust the angle of the wafer W against the XY plane. Further, the position of the XY stage 14 is measured by the external laser interferometer 54W via the moving mirror 52W fixed on the Z-tilt stage 58, and the measurement value is to be supplied to the main controller 50. Note that mirror processing may be performed to the Z-tilt stage 58 (or XY stage 14) to form a reflection plane against the laser interferometer 54W (equivalent to the reflection plane of the above-described moving mirror 52W).

Furthermore, although not shown, a pair of reticle alignment systems of an image processing method, which has an imaging device (image sensor) such as a CCD and uses light of the exposure wavelength (pulse illumination light IL in this embodiment) as the illumination light for alignment, is arranged above the reticle R, as disclosed in Japanese Patent Application Laid-open No.7-176468 and The U.S. Pat. No. 5,646,413 corresponding thereto, or the like. In this case, a pair of the reticle alignment systems is symmetrically arranged (symmetric) with respect to a YZ plane including the optical axis AX of the projection optical system PL. Further, the pair of the reticle alignment systems is structured so that the systems are capable of moving reciprocally in the X-axis direction within the XZ plane that passes the optical axis AX.

Normally, the pair of the reticle alignment systems is set to a position from which the systems are capable of observing a pair of reticle alignment marks arranged outside a light-shield band in a state where the reticle R is mounted on the reticle stage RST. Note that the disclosures cited in the foregoing United States Patent are fully incorporated herein by reference.

The main controller 50 mainly constitutes the control system in FIG. 1. The main controller 50 is constituted including a so-called micro computer (or a workstation) that is made up of a CPU (central processing unit), a ROM (read-only memory), a RAM (random access memory) and the like, and it controls, for example, synchronous scanning of the reticle R and the wafer W, stepping of the wafer W, exposure timing and the like in total so that the exposure operation is accurately performed.

Specifically, at the time of scanning exposure, for example, the main controller 50 controls the positions and the velocity of the reticle stage RST and the XY stage 14 via the reticle stage drive section 48 and the wafer stage drive section 56, based on the measurement values of the laser interferometers (54R, 54W) so that the wafer W is scanned by velocity $\delta \times V_R$ ($\delta$ is projection magnification from reticle R to wafer W) in –Y direction (or +Y direction) with respect to the exposure area 42W via the XY stage 14 synchronously with the reticle R being scanned by velocity $V_R$ in the +Y direction (or –Y direction) via the reticle stage RST. Further, at the time of stepping, the main controller 50 controls the position of the XY stage 14 via the wafer stage drive section 56 based on the measurement value of the laser interferometer 54W.

Furthermore, the main controller 50 controls the emission timing of the light source unit 16, emission power, and the like by supplying the control information to the light source unit 16, as described above. The main controller 50 controls rough energy adjuster 20 and the illumination system aperture stop plate 24 via the motor 38 and the drive unit 40, respectively, and further controls the open/close operation of the movable reticle blind 30B synchronously with the operation information of a stage system. Consequently, the main controller 50 serves as an exposure controller and a stage controller in this embodiment as well. It is a matter of course that these controllers may be provided separately from the main controller 50.

As shown in FIG. 1, the memory 51 as the storage device and an input/output unit 62 such as a console are provided with the main controller 50. Besides information such as the correlation coefficient (or correlation function) between the output DS of the integrator sensor 46 and the illumination (intensity) of the pulse illumination light IL on the surface of the wafer W and the correlation coefficient (or correlation function) between the output ES of the energy monitor 16h and the output DS of the integrator sensor 46, the memory 51 stores information also includes the relationship between the oscillation frequency and the output quality such as energy stability, of the laser resonator 16a in a predetermined range including the usable oscillation frequency (repetition frequency).

Next, an obtaining method of the information showing the relationship between the oscillation frequency and the energy stability as the output quality, of the laser resonator 16a will be described. Such information is obtained, for example, during the startup of the exposure apparatus 10.

a. Firstly, an operator (engineer) enters an instruction of measurement start via the input/output unit 62. In response to the input, the CPU inside the main controller 50 either closes the shutter 16f or withdraws the XY stage 14 from a position below the projection optical system PL. Next, the CPU gives a neutral set value of an energy control target value, such as the minimum value $E_{min}$ and settable minimum oscillation frequency $f_0$, as target values to the laser controller 16e. The laser controller 16e performs feedback control on the power source voltage in the high voltage power source inside the laser power source 16d based on the control target value (set value) of energy $E_{target}$ (=$E_{min}$) and the control target value (set value) of frequency $f_{target}$ (=$f_0$), and also controls the application timing or the application interval of the trigger signal to the pulse compression circuit inside the laser power source 16d. Consequently, the laser resonator 16a starts the pulse emission of the laser beam LB at the oscillation frequency $f_{target}$ (=$f_0$).

b. The CPU sequentially downloads output signal data (digital conversion data of output signals) from the energy monitor 16h per each pulse emission, and stores them into a predetermined data storage area in the RAM. The CPU performs such download of output signal data for a predetermined number of pulses, which are, for example, 100 pulses.

c. When the emission of 100 pulses ends, the CPU supplies ($f_0+\Delta f$), where the control target value of the oscillation frequency has been increased only by a predetermined $\Delta f$, to the laser controller 16e as a new control target value $f_{target}$ of the oscillation frequency. Accordingly, the laser controller 16e controls the laser power source 16d based on the control target values ($E_{target}$, $f_{target}$) similar to the one described above, and pulse emission is performed on the oscillation frequency $f_{target}$. Then, the CPU sequentially downloads the output signal data from the energy monitor 16h per each pulse emission, and stores the output signal data for the 100 pulses in the predetermined data storage area in the RAM.

d. Hereinafter, the same process as the one described above is repeatedly performed, while the control target value of the oscillation frequency is updated to the oscillation frequency $f_{target}$ increased only by $\Delta f$. Then, when $f_{target}$ reaches the settable maximum oscillation frequency $f_{max}$ and download of the above-described output signal data is complete, the pulse emission ends. At this point, a data table is made in the data storage area in the RAM that stores the output signal data for 100 pulses by each control target value of the oscillation frequency from the oscillation frequency $f_0$ to $f_{max}$ at an $\Delta f$ interval.

e. Next, the CPU calculates the dispersion level, which is so-called 3$\sigma$ for example, of the data for every control target value of the oscillation frequency, in the data table. The value of 3σ is none other than an index value of the output energy stability.

Figure 3:
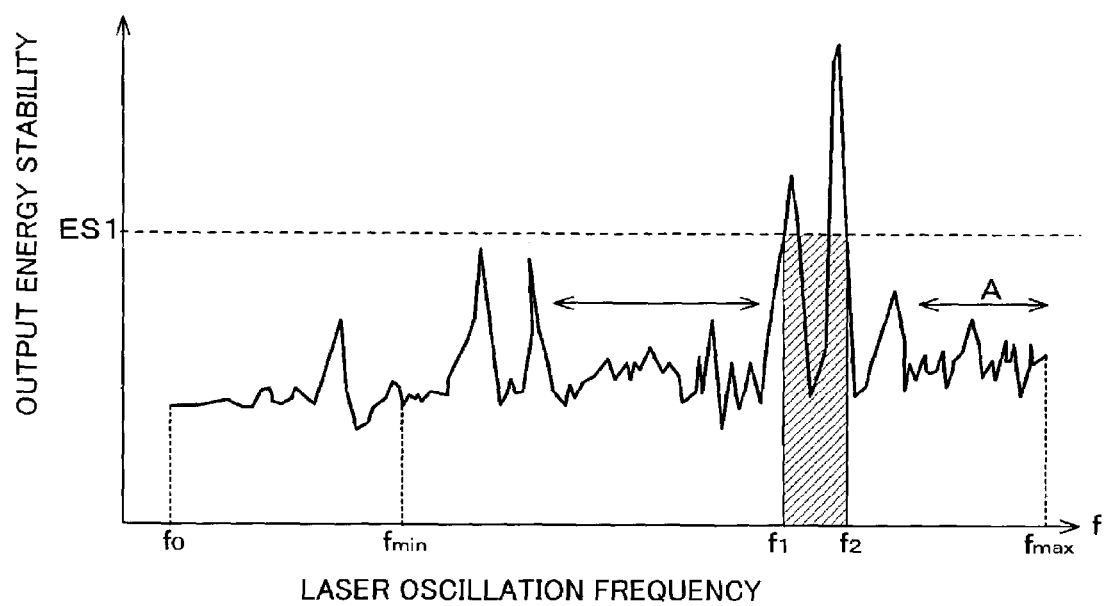
FIG. 3 is a diagram showing an example of information on a relationship between oscillation wavelength and output energy stability, which is stored in a memory.

FIG. 3 shows the distribution of the output energy stability of the laser resonator 16a, which has been obtained in this manner. In FIG. 3, the horizontal axis and the vertical axis respectively show the oscillation frequency of the laser resonator 16a and the index value (3σ) of the output energy stability.

In this embodiment, the memory 51 stores information showing the relationship between the oscillation frequency of the laser resonator 16a and the index value of the output energy stability as is shown in FIG. 3. In FIG. 3, ES1 on the vertical axis shows a permissible limit value of the index value of the output energy stability. Further, in FIG. 3, the shaded region between the frequency $f_1$ and $f_2$ shows a particular oscillation frequency range (referred to as 'particular frequency range' hereinafter) within the usable oscillation frequency range of the light source unit 16, where the output energy stability deteriorates. Further, the range between the frequency $f_{min}$ and $f_{max}$ is the oscillation frequency range that can be used in the exposure apparatus. Note that the range between the frequency $f_0$ and $f_{min}$ is a frequency range that the exposure apparatus does not use.

Next, description will be given for the dose control in the exposure apparatus 10 in this embodiment with reference to the flowchart in FIG. 4 that shows the processing algorithm of the CPU in the main controller 50. In the following description, as the light source unit 16 (laser resonator 16a), a light source unit that can be used by changing pulse energy E per one pulse in the range from $E_{min}$ (8 mJ/pulse, for examples) to $E_{max}$ (10 mJ/pulse, for example) and changing the oscillation frequency f of pulse emission in the range from $f_{min}$ (600 Hz, for example) to $f_{max}$ (4000 Hz, for example) is used as an example.

On actual operation, the output DS of the integrator sensor 46 is previously calibrated to the output of a reference illuminometer (not shown) installed to the same height as that of the image plane (in other words, surface of wafer) on the Z-tilt stage 58 of FIG. 1, by which conversion coefficient a showing the relationship between the image plane illumination intensity and the output of the integrator sensor 46 is obtained for every illumination condition. Then, prior to exposure, by using the integrator sensor 46 and the energy monitor 16h in the light source unit 16, a predetermined control table showing the correlation between the dose indirectly obtained by the output DS of the integrator sensor 46, that is, processing quantity p (mJ/(cm²×pulse)) of the integrator sensor 46, and the output ES (mJ/pulse) of the energy monitor 16h in the light source unit 16 is formed according to a predetermined procedure disclosed in Japanese Patent Application Laid-open No. 10-270345 publication and The U.S. Pat. No. 6,538,723 corresponding thereto, or the like, for example. Note that the disclosure cited in the foregoing United States Patent is fully incorporated herein by reference.

However, in the following explanation, the correlation between the integrator sensor 46 and the energy monitor 16h is expressed in a linear function for simplicity, and it is assumed that its offset can be regarded as 0 and its slope can be treated as conversion coefficient β. Specifically, it is assumed that the output ES (mJ/pulse) of the energy monitor 16c can be calculated by the following expression using the processing quantity p (mJ/(cm²×pulse)) of the integrator sensor 46 and conversion coefficient β.

$$ES = \beta \times p \qquad (3)$$

Note that, when the above-described optical unit is provided particularly, it is preferable that the conversion coefficient β be obtained for every incident condition of the illumination light to the optical integrator 22, which is variable by the optical unit. Further, it is desirable that the conversion coefficient (α,β) be updated by calculation taking into consideration the transmittance fluctuation of the pulse illumination light IL from the illumination optical system that constitutes the illumination system 12, the projection optical system PL, or the like.

Further, to minimize an exposure time in the entire set dose, the transmittance (discrete transmittance) of the rough energy adjuster 20 is to be designed so that it is in geometric progression.

Figure 4:
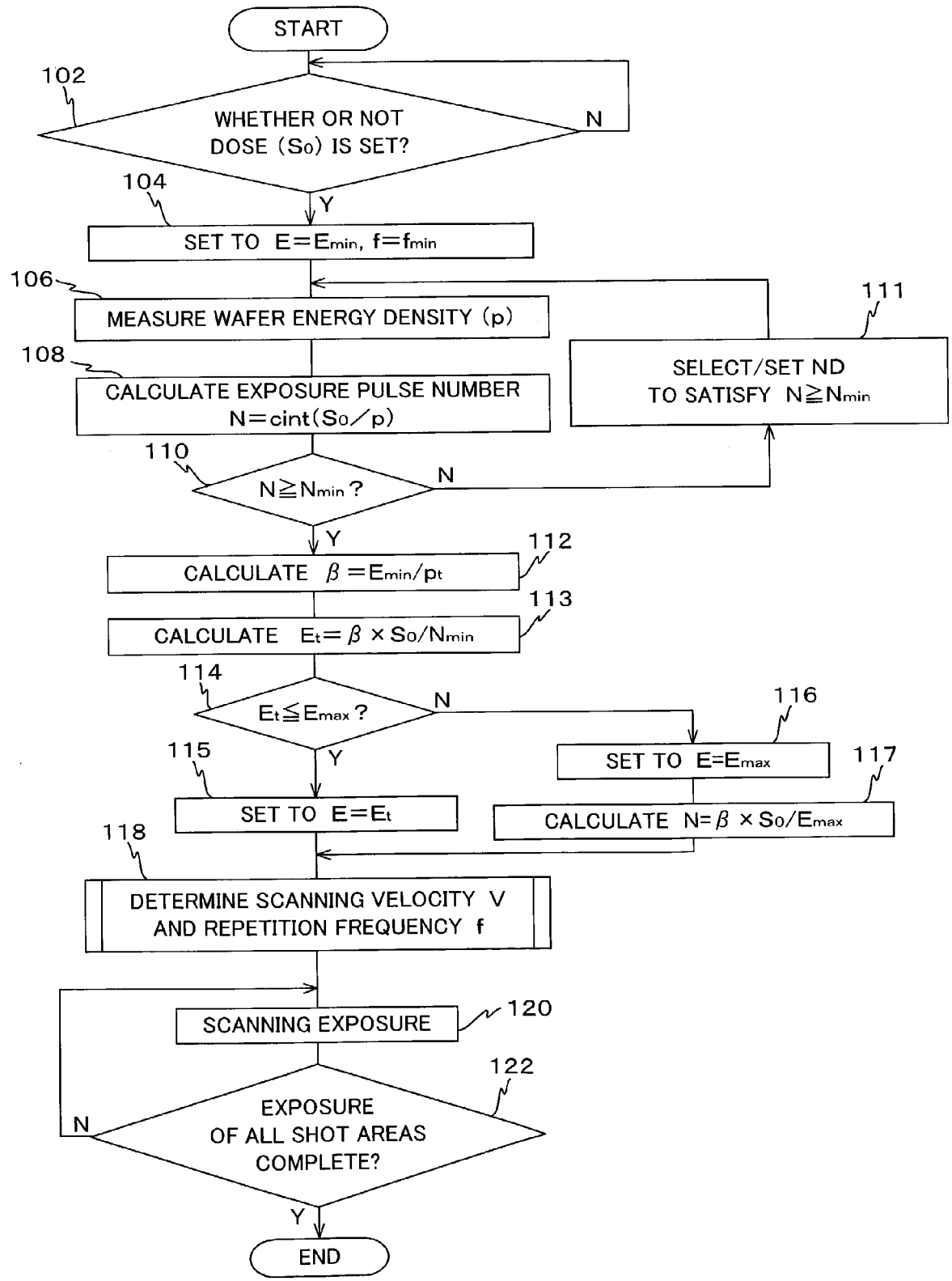
FIG. 4 is a flowchart showing a processing algorithm of a CPU in a main controller 50 when dose control is performed in the exposure apparatus of the first embodiment.
Figure 5:
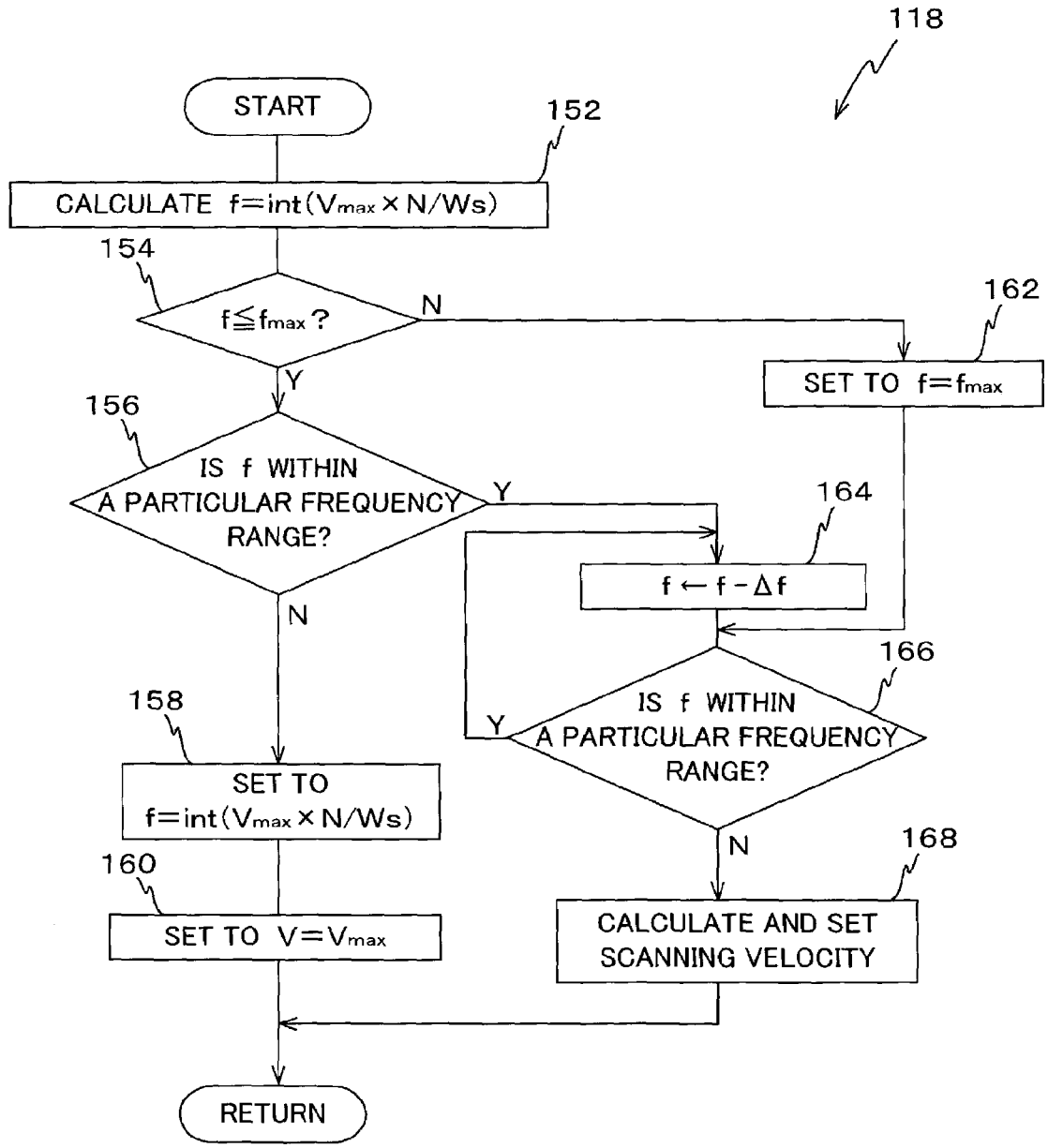
FIG. 5 is a flowchart showing the processing in sub-routine 118 of FIG. 4.

Firstly, at step 102 of FIG. 4, the CPU waits until the operator sets a set dose $S_0$ via the input/output unit 62 (refer to FIG. 1), proceeds to the next step 104 when the set dose $S_0$ is set, and sets the energy E per one pulse of the laser beam LB and the oscillation frequency f to the minimum energy quantity $E_{min}$ (8 mJ/pulse) and the minimum frequency $f_{min}$ (600 Hz), respectively, via the laser controller 16e. In other words, neutral setting is performed on the pulse energy and the oscillation frequency in this manner.

At the next step 106, the light source unit 16 is allowed to perform pulse emission for plural times (a few hundred times, for example) to integrate the output of the integrator sensor 46, and thereby an average pulse energy density p (mJ/(cm²×pulse)) on the wafer W is indirectly measured. This measurement is performed in a state where the movable reticle blind 30B is driven so that its aperture is completely closed and the pulse illumination light IL is prevented from reaching the reticle R. Of course, it also may be performed in a state where the XY stage 14 is driven so that the wafer W is withdrawn.

At the next step 108, an exposure pulse number N is calculated by the following expression (4).

$$N = \mathrm{cint}(S_0/p) \qquad (4)$$

Herein, the function cint expresses rounding off the first decimal value.

At the next step 110, a decision is made whether or not the exposure pulse number N is the minimum exposure pulse number $N_{min}$ or more to obtain necessary reproduction accuracy of dose control. Herein, the minimum exposure pulse number $N_{min}$ is a value that is obtained based on $\delta_p/p$, which is the ratio of the dispersion (value of 3σ) $\delta_p$ of pulse energy previously measured and set as an apparatus constant, to the average pulse energy density p, for example. In this embodiment, for example, the value is $N_{min} = 40$.

Then, when the decision at step 110 is denied, that is, when the exposure pulse number N is smaller than the minimum exposure pulse number $N_{min}$, the procedure proceeds to step 111, and the processing of step 106 is performed again after selecting and setting an ND filter whose transmittance is smaller than and closest to $S_0/(N_{min} \times p)$ out of the transmittance settable by the ND filters of the rough energy adjuster 20 of FIG. 1. Then, the average pulse energy density $p = p_t$ under the selected ND condition is newly obtained, and the processing of step 108 is performed using the average pulse energy density $p_t$. When the determination at step 110 is affirmed in this manner, or the determination at step 110 is originally affirmed (case of $N \geq N_{min}$), the procedure proceeds to step 112. Note that the average pulse energy density p when the determination at step 110 is originally affirmed satisfies $N \geq N_{min}$, similar to the average pulse energy density $p_t$ under the above-described selected ND condition, so that p should be treated as $p_t$ hereinafter.

At step 112, the above-described conversion coefficient β is calculated based on the following expression (5) by using the energy density $p_t$ obtained in step 106. Of course, the calculation is not limited to this, and when the control table described above is previously obtained, the conversion coefficient β corresponding to the average pulse energy density $p_t$ may be calculated from the control table.

$$\beta = E_{min}/p_t \tag{5}$$

At the next step 113, an energy set value $E_t$ (mJ/pulse) of the laser beam LB per one pulse is calculated by the following expression (6), and procedure proceeds to step 114.

$$E_t = \beta \times S_0/N_{min} \tag{6}$$

At step 114, the decision is made whether or not the energy set value $E_t$ is the settable maximum energy $E_{max}$ (10 mJ/pulse in this case) or less. Then, when the determination is affirmed, procedure proceeds to step 115 to supply the energy set value $E_t$ to the laser controller 16e. Consequently, the laser controller 16e sets the energy E of one pulse to $E_t$. Then, procedure proceeds to a sub-routine at step 118 where the scanning velocity V and the oscillation frequency f are determined.

On the other hand, when the decision at the above-described step 114 is denied, that is, when the energy set value $E_t$ calculated before is larger than the settable maximum energy $N_{max}$, the procedure proceeds to step 116 to supply $E_t = E_{max}$ as the energy set value to the laser controller 16e because such setting of energy is impossible. Thus, the laser controller 16e sets the energy E of one pulse to $E_{max}$.

In this case, since $N=N_{min}$ does not hold, procedure proceeds to the next step 117 to calculate the exposure pulse number N according to the next expression (7), and then, proceeds to sub-routine 118 where the scanning velocity V and the oscillation frequency f are determined.

$$N = \beta \times S_0/E_{max} \tag{7}$$

At sub-routine 118, the oscillation frequency f is calculated by the following expression (8) based on the scanning velocity V=the scanning maximum velocity ($V_{max}$).

$$f = int(V_{max} \times N/Ws) \tag{8}$$

Herein, the function int(a) expresses the largest integer no more than real number a.

On the next step 154, the decision is made whether or not the oscillation frequency f calculated above is the maximum oscillation frequency $f_{max}$ or less of the laser. Then, when the decision is affirmed, procedure proceeds to step 156 where the particular frequency range (range between $f_1$ and $f_2$ in FIG. 3) is specified based on the information stored in the memory 51, and the decision is made whether or not the oscillation frequency f calculated above is within the particular frequency range. When the determination is denied, that is, when the frequency f is out of the particular frequency range, procedure proceeds to step 158, and the oscillation frequency f is set to the value calculated at step 152 via the laser controller 16e and a scanning target velocity (scanning velocity) is set to the scanning maximum velocity $V_{max}$ at the next step 160. After that, the procedure returns to step 120 of the main routine.

On the other hand, when the decision made at step 156 is affirmed, it is not appropriate to set the oscillation frequency f calculated at step 152 as it is because it belongs to the frequency range where the output energy stability is out of a permissible range. Consequently, procedure proceeds to step 164 to set (change) the oscillation frequency f to (f−Δf) via laser controller 16e. Subsequently, the decision is made whether or not the set oscillation frequency f is within the above-described particular frequency range at step 166. When the decision is affirmed, procedure returns to step 164 to set (change) the oscillation frequency f to (f−Δf) via laser controller 16e. Thereafter, the processing and decision making of step 164 and 166 are repeated until the decision at step 166 is denied. Then, when the set oscillation frequency becomes out of the particular frequency range and the decision at step 166 is denied, procedure proceeds to step 168 to calculate the scanning velocity V based on the following expression (9) and to set it accordingly.

$$V = Ws \times f/N \tag{9}$$

In this case, the scanning velocity V is set to a value lower than the maximum scanning velocity. Then, the procedure returns to step 120 of the main routine.

On the other hand, when the decision at step 154 is denied, since setting of the oscillation frequency f calculated at step 152 is impossible, procedure proceeds to step 162. At step 162, the oscillation frequency f is set to the maximum oscillation frequency $f_{max}$ via the laser controller 16e, and the procedure proceeds to step 166.

At step 166, the decision is made whether or not the set oscillation frequency f ($=f_{max}$) is within the above-described particular frequency range, but in this embodiment, as it is clear from FIG. 3, $f_{max}$ is out of the particular frequency range. Therefore, the decision at step 166 is denied and the procedure proceeds to step 168. At step 168, the scanning velocity V is calculated based on the above-described expression (9), and it is set accordingly. In this case, $f_{max}$ is used in calculating the scanning velocity V. Then, procedure returns to step 120 of the main routine.

Note that, unlike FIG. 3, when $f_{max}$ is within the particular frequency range, the decision at step 166 is affirmed and the procedure returns to step 164 to repeat the same process and decision making as the ones previously described.

Then, at step 120 of the main routine, the pattern of the reticle R is transferred onto a designated shot area on the wafer W by the scanning exposure method under the setting conditions (V, f, $E_t$, N) decided at the previous steps.

After the above-described scanning exposure ends, the decision is made whether or not exposure of all shot areas has ended at step 122. When the decision is denied, that is, when a shot area to which exposure should be performed is left, procedure returns to step 120 to perform the scanning exposure to the next shot area.

As is described, a series of processing in this routine ends when the shot area to which exposure should be performed comes to an end.

As it is clear from the foregoing description, in this embodiment, the memory 51 constitutes a storage device that stores the information of the oscillation frequency of the light source unit 16 (more accurately, laser resonator 16a) in the predetermined range including usable oscillation frequency, where the output quality of the light source unit is taken in consideration. Further, a control unit that controls the oscillation frequency as the affecting factor to oscillation environment when the light source unit 16 is oscillated is realized by the main controller 50, or more specifically, the CPU and software program. In other words, the control unit is realized by the processing steps 154, 156, 158, 162, 164 and 166, performed by the CPU. In the control unit, the oscillation frequency of the light source unit 16 is set to the oscillation frequency out of the particular oscillation frequency range where the output quality (output energy stability in this embodiment) deteriorates. Further, the above-described control unit and the memory 51 constitute the laser beam source control unit.

Note that it is a matter of course that at least a part of the constituent realized by the above-described software program may be constituted by hardware.

As it has been described in detail, according to the laser beam source control unit (50 and 51) of this embodiment, in the memory 51, the information of the relationship between the oscillation frequency of the light source unit 16 (more accurately, laser resonator 16a) in the predetermined range including usable oscillation frequency and the output quality (output energy stability as an example), which has been previously obtained in the above-described procedure from a to e (refer to FIG. 3) is stored. Then, the main controller 50 sets the oscillation frequency of the light source unit 16 to the oscillation frequency out of the above-described particular oscillation frequency range based on the above-described information stored in the memory 51. Consequently, the oscillation frequency can be set to an oscillation frequency avoiding at least the frequency within the particular oscillation frequency range (particular oscillation frequency range) where the output quality deteriorates, and thereby the laser resonator 16a whose output quality is always in a good condition can be used.

Further, according to the exposure apparatus 10 of this embodiment, when sequentially transferring the pattern of the reticle R onto each shot area on the wafer W, the main controller 50 controls the oscillation frequency of the light source unit 16 as described above based on the information stored in the memory 51. In this case, since the variation state (distribution) of the output quality in the predetermined range (predetermined frequency range) including the usable oscillation frequency is available due to the information in the memory 51, the main controller 50 can use the information to set the oscillation frequency of the light source unit 16 to an arbitrary oscillation frequency within the oscillation frequency range whose output quality is good, according to the above-described sub-routine 118, for example. Thus, according to the exposure apparatus 10, pattern transfer can be performed by the arbitrary oscillation frequency within the oscillation frequency range whose output quality is good, and thereby the pattern can be formed onto a plurality of shot areas on the wafer W with good accuracy.

In the above-described embodiment, description has been given for the case where the information of the relationship between the oscillation frequency of the light source unit 16 (more accurately, laser resonator 16a) and the output quality (output energy stability as an example) is stored in the memory 51 as the storage device (refer to FIG. 3), but the present invention is not limited to this. For example, information of the particular oscillation frequency range in the usable frequency range of the light source unit (laser beam) 16, where the output quality deteriorates (above-described information of particular oscillation frequency range, for example), may be stored in the memory 51. Even in such a case, the main controller 50 performs the decision making of steps 156 and 166 based on the information in the memory 51, as an example, so that the oscillation frequency of the light source unit (laser beam source) 16 can be set to the oscillation frequency out of the particular oscillation frequency range. For this reason, the oscillation frequency can be set to oscillation frequency avoiding at least outside the frequency within the particular oscillation frequency range where the output quality deteriorates, and thereby the laser beam source whose output quality is always in a good condition can be used. And furthermore, the pattern can be transferred by the arbitrary oscillation frequency within the oscillation frequency range whose output quality is good. Therefore, the pattern can be formed onto a plurality of shot areas on the wafer W with good accuracy.

Further, in the above-described embodiment, the main controller 50 (the CPU) may set the oscillation frequency of the laser beam source 16 to the oscillation frequency range where the output quality (output energy stability, as an example) becomes good (range shown by arrow A in FIG. 3, for example) or to the frequency range where the output quality becomes the best within the range where the output quality becomes good, based on the information in the memory 51. Alternatively, the information of the frequency range where the output quality becomes the best may be stored in the memory 51, and the main controller 50 may set the oscillation frequency of the light source unit (laser beam source) 16 to the frequency within the oscillation frequency range based on the information in the memory 51. This can be easily realized by changing the software. Accordingly, the light source unit 16 can be used in a state where the output quality is always good or the best, and furthermore, the pattern can be transferred by the arbitrary oscillation frequency within the oscillation frequency range whose output quality is good. Therefore, the pattern can be formed onto a plurality of shot areas on the wafer W with good accuracy.

In the above-described embodiment, the memory 51 stores the information of the relationship between the above-described oscillation frequency and the output quality (such as output energy stability), which has been previously obtained in the procedure from a to e, but the present invention is not limited to this and the RAM of the main controller 50 may store the information. In this case, the RAM constitutes the storage device. Further, it the relationship between the oscillation frequency and the output quality does not necessarily have to be obtained by using the exposure apparatus, but it may be obtained by the same procedure as the above-described a to e using only the light source unit 16 before installing it into the exposure apparatus.

In the above-described embodiment, instead of or in addition to the above-described information showing the relationship between the oscillation frequency and the output energy stability, information showing the relationship between the oscillation frequency of the light source unit 16 and output quality other than the output energy stability, such as the relationship between the index value of wavelength stability (center wavelength stability) and oscillation frequency, or the relationship between the spectrum line width (index value of the variation characteristic of spectrum line width) and the oscillation frequency, or the like may be stored in the memory 51 as the information of the relationship between the oscillation frequency of the light source unit 16 (more accurately, laser resonator 16a) and the output quality in the predetermined range including the usable frequency range. Such information may be previously obtained by performing an experiment similar to the case of the above-described output energy stability. However, in the case of the index value of wavelength stability (center wavelength stability) and the spectrum line width, the output data are downloaded from the beam monitor mechanism 16c instead of the above-described energy monitor. Then, the main controller 50 may set the oscillation frequency to the frequency range out of the particular frequency range where the output quality deteriorates or may set the oscillation frequency to the frequency within the particular frequency range where the output quality becomes good, at steps 156 and 166 in the processing of the above-described sub-routine 118. Particularly, in the case where the memory 51 stores plural kinds of information from the information showing the relationship between the oscillation frequency and the output energy stability, the information showing the relationship between the index value of the wavelength stability (center wavelength stability) and the oscillation frequency, the information showing the relationship between the spectrum line width (index value of variation characteristic of spectrum line width) and the oscillation frequency, and the like, the oscillation frequency may be set to the frequency within the particular frequency range where the plural pieces of output quality are all good. This can also be easily achieved by changing the software.

In the above-described embodiment, description has been given for a method where the oscillation frequency (oscillation frequency) f is set to the frequency within the frequency range whose output quality is good by a method of repeating a change in the oscillation frequency f, from f to (f−Δf), when the oscillation frequency f is within the particular frequency range at steps 156 and 166. However, the oscillation frequency f may be immediately set to an arbitrary oscillation frequency where the output energy stability is within the range of ES1 based on the information shown in FIG. 3.

Second Embodiment

Next, a second embodiment of the present invention will be described based on FIGS. 6 and 7. Herein, constituents same as or equivalent to those of the above-described first embodiment use the same reference numerals, and description thereof is simplified or omitted. In the exposure apparatus according to the second embodiment, the apparatus configuration and the like are the same as the exposure apparatus 10 according to the above-described first embodiment, and what is different is only the information stored in the memory 51 and a part of the processing algorithm of the CPU in the main controller 50. Thus, the following description will mainly be on such different points.

In the second embodiment, in addition to the information of the relationship between the oscillation frequency and the output quality of the light source unit 16 (more accurately, laser resonator 16a) in the predetermined range including the usable frequency range (information showing the relationship between the above-described oscillation frequency and the output energy stability: also referred to as 'information A' hereinafter) that has been stored in the above-described first embodiment, the memory 51 also stores information showing the relationship between the fluctuation quantity of the temperature T of laser gas inside the excimer laser tube 202 (a type of control factor) and the fluctuation quantity of the oscillation frequency f (also referred to as 'information B' hereinafter) that is obtained in advance by performing an experiment or the like. By using information A and B, the relationship between the oscillation frequency of the light source unit 16, the energy stability that is a type of the output quality, and the laser gas temperature T that is a predetermined control factor other than the oscillation frequency regarding the oscillation of the light source unit 16 is obtained. Specifically, in the memory 51, the information substantially showing the relationship among the above three is stored.

Figure 6:
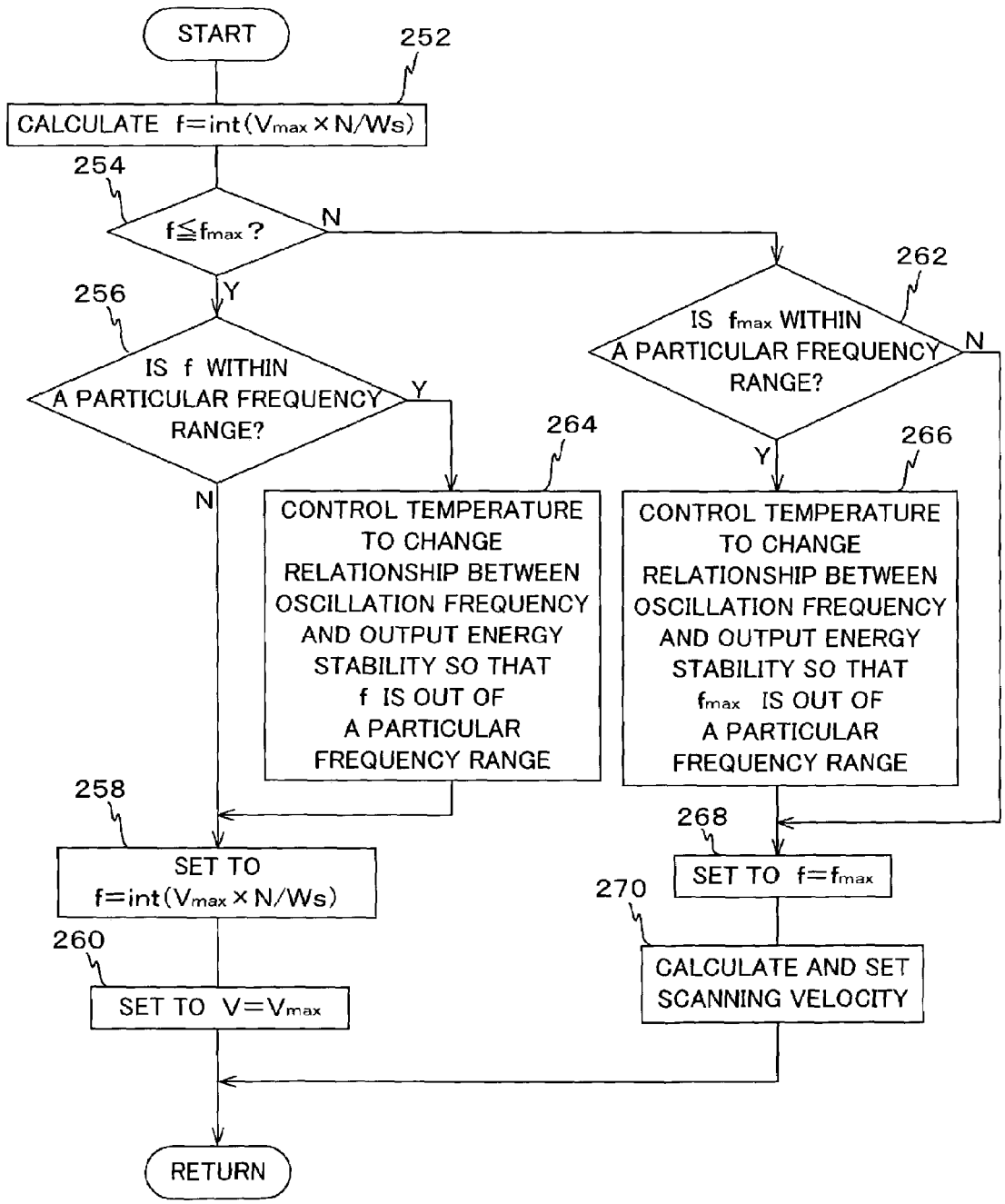
FIG. 6 is a view showing an example of a sub-routine (corresponds to sub-routine 118 in FIG. 4) that determines scanning velocity V and oscillation frequency f, which is a part of the processing algorithm of a CPU in a main controller 50 on dose control in an exposure apparatus of a second embodiment.

FIG. 6 shows an example of a sub-routine (corresponds to sub-routine 118 in FIG. 4) that determines the scanning velocity V and the oscillation frequency f, which is a part of the processing algorithm of the CPU in the main controller 50 related to dose control according to the second embodiment.

In this sub-routine, first of all, at step 252, the oscillation frequency f is calculated by the above-described expression (8) in the same manner as step 152, with the scanning velocity V=the scanning maximum velocity ($V_{max}$).

Then, at the next step 254, the decision is made whether or not the oscillation frequency f calculated above is the maximum oscillation frequency $f_{max}$ or less of the laser. When the decision is affirmed, the procedure proceeds to step 256 to decide whether or not the oscillation frequency f calculated above is within the particular frequency range (range between $f_1$ and $f_2$ in FIG. 3) stored in the memory 51. When the decision is denied, that is, when it is out of the particular frequency range, the procedure proceeds to step 258 to set the oscillation frequency f to the value calculated at step 252 in the same manner as described above, and the scanning target velocity (scanning velocity) is set to the scanning maximum velocity $V_{max}$ at the next step 260. After that, the procedure returns to step 120 of the main routine of FIG. 4.

On the other hand, when the decision at step 256 is affirmed, it is not appropriate to set the oscillation frequency f calculated at step 252 as it is because it belongs to the frequency range where the output energy stability is out of the permissible range. Consequently, procedure proceeds to step 264 where the control system of the heater and the cooling unit in the above-described excimer laser tube 202 is controlled based on information A and B in the memory 51 in order to control the laser gas temperature so that the relationship between the oscillation frequency and the output energy stability is changed to make the oscillation frequency f calculated at step 252 deviate from the particular frequency range.

Figure 7:
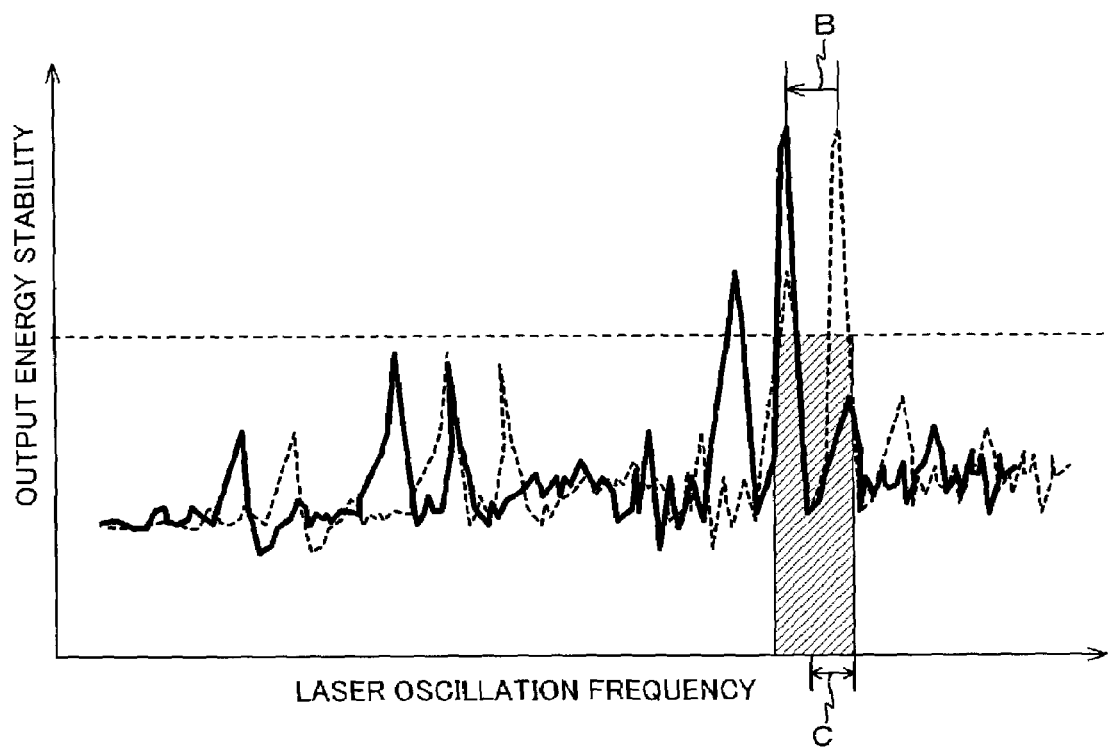
FIG. 7 is a view for explaining an operation in the second embodiment.

By the above-described temperature control, the flow velocity of the laser gas in the excimer laser tube 202 changes, and as an example the output energy stability to oscillation frequency curve, which has originally been the waveform shown in a broken line, shifts to the lower frequency direction as is shown by arrow B, and changes to the waveform shown by a solid line as is shown in FIG. 7. Consequently, the oscillation frequency that has originally been within the particular frequency range, such as the output energy stability in the frequency range of arrow C in FIG. 7 becomes within the permissible value. Specifically, the oscillation frequency range where the output quality deteriorates goes off from the oscillation frequency range (frequency range of arrow C) to be used.

When the processing at step 264 ends, since the oscillation frequency (frequency to be used) f calculated at step 252 belongs to the frequency range where the output energy stability becomes within the permissible range, procedure proceeds to step 258 to set the oscillation frequency f to the value calculated at step 252 similar to the case where the decision at step 256 has been denied, and the scanning target velocity (scanning velocity) is set to the scanning maximum velocity $V_{max}$. Then, procedure returns to step 120 of the main routine of FIG. 4.

On the other hand, when the decision at step 254 is denied, the procedure proceeds to step 262 because setting of the oscillation frequency f calculated at step 252 is impossible. At step 262, the decision is made whether or not the oscillation frequency f (=$f_{max}$) is within the above-described particular frequency range, however, in this embodiment, it is clear from FIG. 3 that $f_{max}$ is out of the particular frequency range. As a result, the decision at step 262 is denied and the procedure proceeds to step 268.

At step 268, after the oscillation frequency f is set to the maximum oscillation frequency $f_{max}$ via the laser controller 16e, the procedure proceeds to step 268 to calculate the scanning velocity V based on the above-described expression (9), and it is set accordingly. In this case, $f_{max}$ is used in calculating the scanning velocity. The scanning velocity V is set to a predetermined value lower than the maximum scanning velocity. Then, the procedure returns to step 120 of the main routine.

Note that, unlike FIG. 3, when $f_{max}$ is within the particular frequency range, the decision at step 262 is affirmed and the procedure proceeds to step 266 where the control system of the heater and the cooling unit in the above-described excimer laser tube 202 is controlled based on information A and B in the memory 51 in order to control the laser gas temperature so that the relationship between the oscillation frequency and the output energy stability is changed to make the maximum oscillation frequency $f_{max}$ deviate from the particular frequency range.

In any case, the processing after step 120 of the main routine is the same as that of the first embodiment.

As it is clear from the foregoing description, in the second embodiment, the memory 51 constitutes the storage device that stores the information of the oscillation frequency of the light source unit 16 (more particularly, laser resonator 16a) in the predetermined range including the usable oscillation frequency with consideration of the output quality of the light source unit, more specifically, the information showing the relationship between the oscillation frequency, the output quality, and the predetermined control factor other than the oscillation frequency (laser gas temperature) regarding the oscillation of the light source unit 16, similar to the above-described first embodiment. Further, a control unit that controls the temperature of the laser gas as the affecting factor to oscillation environment when the light source unit 16 is oscillated is realized by the main controller 50, or more specifically, the CPU and software program. In other words, the control unit is realized by the processing steps 256, 264, 262, and 266, performed by the CPU. The control unit controls the laser gas temperature, by which the relationship between the oscillation frequency and the output quality is changed. Further, the above-described control unit and the memory 51 constitute the laser beam source control unit.

Note that it is a matter of course that at least a part of the constituent realized by the above-described software program may be constituted by hardware.

As it has been described in detail, according to the laser beam source control unit (50 and 51) of the second embodiment, the laser beam source whose output quality is always good can be used similar to the above-described first embodiment. Furthermore, according to the exposure apparatus of the second embodiment, the pattern can be transferred by the arbitrary oscillation frequency within the oscillation frequency range where the output quality is good, and thereby the pattern can be formed onto a plurality of shot areas on the wafer W with good accuracy.

In the above-described second embodiment, description has been given for the case where the information on the relationship between the oscillation frequency of the light source unit 16, the output quality (output energy stability as an example), and the laser gas temperature as the control factor other than the oscillation frequency is stored in the memory 51, but the present invention is not limited to this. For example, information on the relationship between oscillation frequency of the light source unit 16, at least one of the index value of the wavelength stability (center wavelength stability) and the spectrum line width (index value of variation characteristic of spectrum line width), and the predetermined factor (at least one of laser gas temperature and laser gas flow velocity), or the like may be stored in the memory 51. Even in such a case, the effect equal to the above-described embodiment can be obtained by the main controller 50 making the decisions of steps 256 and 262 based on the information in the memory 51, and performing the same processing as steps 264 and 266 based on the information in the memory 51.

Further, in the above-described second embodiment, the main controller 50 (the CPU) may control the laser gas temperature in the above-described excimer laser tube 202 to change the relationship between the oscillation frequency and the output quality based on information A and B in the memory 51, so that the oscillation frequency range of the light source unit whose output quality (output energy stability, as an example) is most stable matches a desired frequency, such as the oscillation frequency calculated at step 252.

This can be easily realized by changing the software. Accordingly, the light source unit 16 can be used in a state where the output quality is always good or the best, and furthermore, the pattern can be transferred by the arbitrary oscillation frequency within the oscillation frequency range whose output quality is good. Therefore, the pattern can be formed onto a plurality of shot areas on the wafer W with good accuracy.

Note that also in the second embodiment, information A and B may be stored in the RAM of main controller 50. In this case, the RAM constitutes the storage device.

Further, in the above first and second embodiments, description has been given for the case where the main controller 50 controls the oscillation frequency of the laser beam source 16 from outside the laser beam source 16, but the present invention is not limited to this. In other words, the laser controller 16e inside the housing 17 may have the function of setting and controlling the oscillation frequency.

Note that, in each of the above-described embodiments, description has been given for the case where the present invention was applied for the scanning exposure apparatus of a step-and-scan method, but the present invention is not limited to this, and can be preferably applied to an exposure apparatus of a step-and-repeat method (so-called stepper) or an exposure apparatus of a step-and-stitch method.

The usage of the exposure apparatus to which the present invention is applied is not limited to the exposure apparatus for manufacturing semiconductor devices, and the present invention can also be widely applied to an exposure apparatus for liquid crystals that transfers a liquid crystal display device pattern onto a square glass plate, a display device such as a plasma display and an organic EL, and an exposure apparatus to manufacture a thin film magnetic head, a micromachine, a DNA chip, and the like. In addition, The present invention can also be applied not only to the exposure apparatus for manufacturing microdevices such as semiconductors, but to an exposure apparatus that transfers a circuit pattern onto a glass substrate or a silicon wafer in order to manufacture a reticle or a mask, which is used in an optical exposure apparatus, an EUV exposure apparatus, an X-ray exposure apparatus, an electron beam exposure apparatus, and the like.

Furthermore, in each of the above-described embodiments, as the laser beam, a harmonic may be used, which is generated by amplifying a single-wavelength laser beam in an infrared region or a visible region oscillated from a DFB semiconductor laser or a fiber laser with an erbium-doped (or both of erbium and ytterbium doped) fiber amplifier, and performing wavelength conversion on the laser beam so as to convert it into an ultraviolet beam with a non-linear optical crystal.

For example, when the oscillation frequency of the single-wavelength laser is within the range of 1.51 to 1.59 µm, the eighth-harmonic having a generation wavelength within the range of 189 to 199 nm or the tenth-harmonic having a generation wavelength within the range of 151 to 159 nm is output. Particularly, when the oscillation wavelength is within the range of 1.544 to 1.553 µm, the eighth-harmonic having a generation wavelength within the range of 193 to 194 nm, that is, an ultraviolet beam having substantially the same wavelength as that of the ArF excimer laser is generated. When the oscillation wavelength is within the range of 1.57 to 1.58 µm, the tenth-harmonic having a generation wavelength within the range of 157 to 158 nm, that is, an ultraviolet beam having substantially the same wavelength as that of the $F_2$ laser is generated.

Further, when the oscillation frequency is within the range of 1.03 to 1.12 µm, the seventh-harmonic having a generation wavelength within the range of 147 to 160 nm is output. Particularly, when the oscillation wavelength is within the range of 1.099 to 1.106 µm, the seventh-harmonic having a generation wavelength within the range of 157 to 158 nm, that is, an ultraviolet beam having substantially the same wavelength as that of the $F_2$ laser is generated. Incidentally, as the single-wavelength oscillation laser, an ytterbium-doped fiber laser is used.

In addition, a light source that generates a vacuum ultraviolet beam such as a $Kr_2$ laser (krypton dimer laser) having the wavelength of 146 nm and the $Ar_2$ laser (argon dimer laser) having the wavelength of 126 nm may be used.

Furthermore, the magnification of the projection optical system is not limited to only a reduction system, but also may be an equal magnification or an enlarged magnification.

<<Device Manufacturing Method>>

Next, an embodiment of a device manufacturing method that uses the exposure apparatus 10 and the exposure method described above is described.

Figure 8:
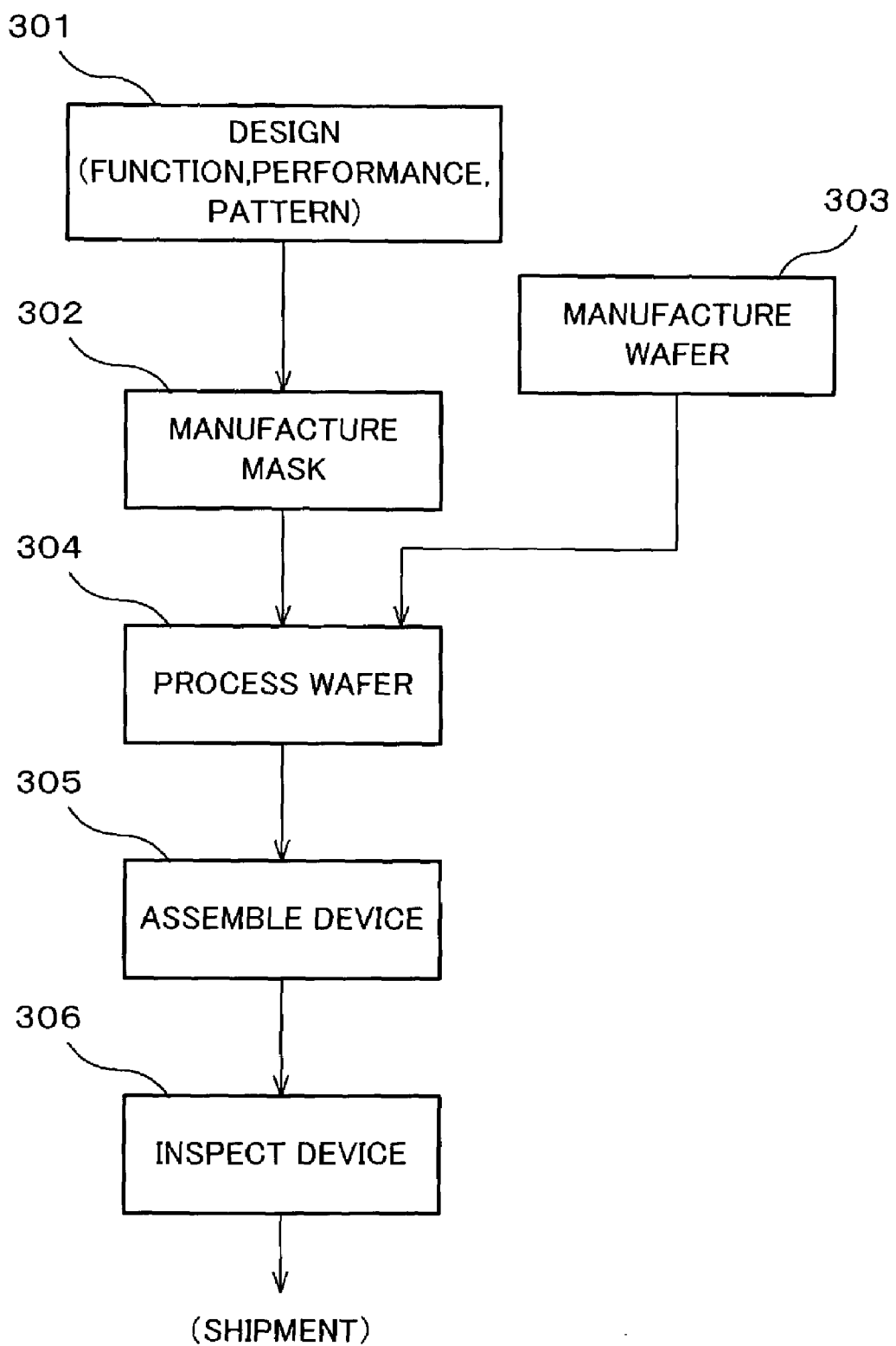
FIG. 8 is a flowchart for explaining an embodiment of a device manufacturing method according to the present invention.

FIG. 8 is a flow chart showing an example of manufacturing a device (a semiconductor chip such as an IC or an LSI, a liquid crystal panel, a CCD, a thin magnetic head, a micromachine, or the like). As shown in FIG. 8, in step 301 (design step), function/performance is designed for a device (e.g., circuit design for a semiconductor device) and a pattern to implement the function is designed. In step 302 (mask manufacturing step), a mask on which the designed circuit pattern is formed is manufactured, whereas, in step 303 (wafer manufacturing step), a wafer is manufacturing by using a silicon material or the like.

In step 304 (wafer processing step), an actual circuit and the like is formed on the wafer by lithography or the like using the mask and wafer prepared in steps 301 to 303, as will be described later. Next, in step 305 (device assembly step) a device is assembled using the wafer processed in step 304. The step 305 includes processes such as dicing, bonding, and packaging (chip encapsulation), as necessary.

Finally, in step 306 (inspection step), tests on operation, durability, and the like are performed on the device processed in step 305. After these steps, the device is completed and shipped out.

Figure 9:
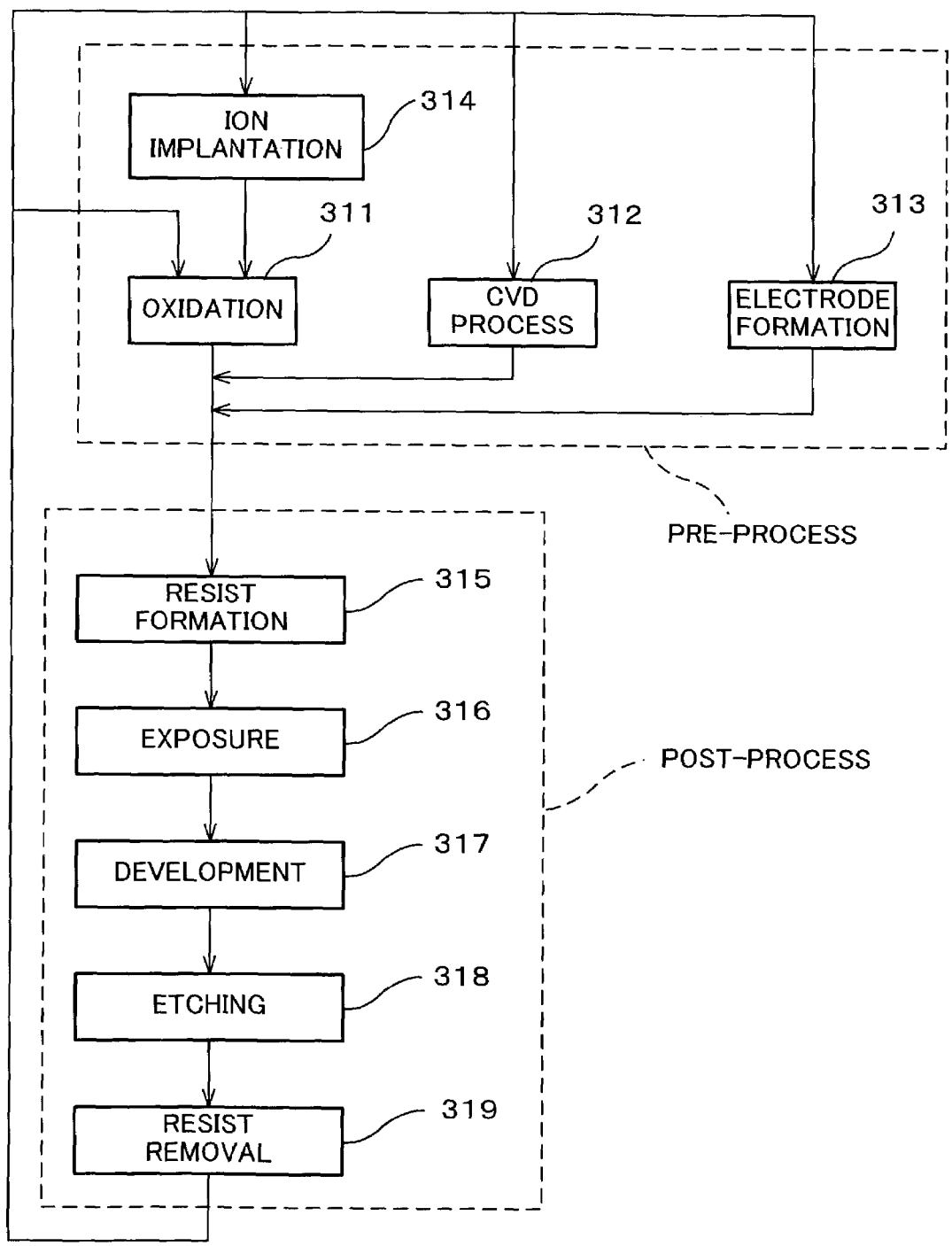
FIG. 9 is a flowchart showing an example of the processing in step 304 of FIG. 8.

FIG. 9 is a flow chart showing a detailed example of step 304 described above in manufacturing the semiconductor device. Referring to FIG. 9, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above make up a pre-process for the respective steps in the wafer process, and are selectively executed depending on the processing required in the respective steps.

When the above pre-process is completed in the respective steps in the wafer process, a post-process is executed in the following manner. In this post-process, first, in step 315 (resist formation step), the wafer is coated with a photosensitive agent. Next, in step 316 (exposure step), the circuit pattern on the mask is transferred onto the wafer by the exposure apparatus and the exposure method described above. And, in step 317 (development step), the wafer that has been exposed is developed. Then, in step 318 (etching step), an exposed member of an area other than the area where the resist remains is removed by etching. Finally, in step 319 (resist removing step), when etching is completed, the resist that is no longer necessary is removed.

By repeatedly performing these pre-process and post-process steps, multiple circuit patterns are formed on the wafer.

When using the device manufacturing method in the embodiment, since the exposure apparatus and the exposure method described in the above embodiments are used in the exposure process, the pattern can be formed on each shot area on the wafer with high accuracy, which improves the yield of the microdevices, which in turn can improve the productivity of the microdevices.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A laser beam source control method in which a laser beam source that is applicable to an exposure apparatus exposing a substrate with an exposure beam while relatively scanning the substrate with respect to the exposure beam, and also generates a beam to be used as the exposure beam and whose oscillation frequency is variable is controlled, said method comprising:
    an obtaining process in which information including a relationship between an oscillation frequency of said laser beam source in a predetermined range including a usable oscillation frequency and an output quality of said laser beam source is obtained; and
    a controlling process in which said oscillation frequency of said laser beam source is determined based on said information obtained in said obtaining process, and an oscillation environment affecting factor that affects an oscillation environment when oscillating said laser beam source is controlled, based on the determined oscillation frequency, wherein
    said information is information for judging whether said oscillation frequency of said laser beam source is appropriate or not while taking into consideration said output quality of said laser beam source, said oscillation frequency being calculated in accordance with an exposure pulse number and scanning velocity when said exposure apparatus performs scanning exposure.

2. The laser beam source control method according to claim 1, wherein
in said obtaining process, information on a relationship between said oscillation frequency and said output quality of said laser beam source is obtained as said information, and
in said controlling process, said oscillation frequency of said laser beam source is controlled as said oscillation environment affecting factor.

3. The laser beam source control method according to claim 2, wherein
in said controlling process, an oscillation frequency range where said output quality becomes the best is specified based on said information, and said oscillation frequency of said laser beam source is set to an oscillation frequency within said specified oscillation frequency range.

4. The laser beam source control method according to claim 2, wherein
in said controlling process, an oscillation frequency range where said output quality deteriorates is specified based on said information, and said oscillation frequency of said laser beam source is set to an oscillation frequency out of said specified oscillation frequency range.

5. The laser beam source control method according to claim 1, wherein
in said obtaining process, information on a particular oscillation frequency range where said output quality deteriorates is obtained as said information, and
in said controlling process, said oscillation frequency of said laser beam source is controlled as said oscillation environment affecting factor, and said oscillation frequency is set avoiding said particular oscillation frequency range.

6. The laser beam source control method according to claim 1, wherein
in said obtaining process, information on a particular oscillation frequency range where said output quality becomes the best is obtained as said information, and
in said controlling process, said oscillation frequency of said laser beam source is controlled as said oscillation environment affecting factor, and said oscillation frequency is set to an oscillation frequency within said particular oscillation frequency range.

7. The laser beam source control method according to claim 1, wherein
in said obtaining process, information on a relationship between said oscillation frequency, said output quality, and a predetermined control factor other than said oscillation frequency related to oscillation of said laser beam source is obtained as said information, and
in said controlling process, said predetermined control factor is controlled as said oscillation environment affecting factor so as to change a relationship between said oscillation frequency and said output quality.

8. The laser beam source control method according to claim 7, wherein
in said controlling process, said relationship between said oscillation frequency and said output quality is changed by controlling said control factor so that an oscillation frequency range where said output quality deteriorates goes off from said oscillation frequency range to be used.

9. The laser beam source control method according to claim 7, wherein
in said controlling process, said relationship between said oscillation frequency and said output quality is changed by controlling said control factor so that an oscillation frequency range of said laser beam source whose said output quality is most stable matches a desired frequency.

10. The laser beam source control method according to claim 7, wherein
in said controlling process, said oscillation frequency of said laser beam source is set to an oscillation frequency out of said oscillation frequency range where said output quality deteriorates, after said predetermined control factor is controlled.

11. The laser beam source control method according to claim 7, wherein
said control factor includes at least either one of flow velocity and temperature of gas inside said laser beam source.

12. The laser beam source control method according to claim 1, wherein
said output quality includes at least one of energy stability, wavelength stability, and variation characteristics of spectrum line width of laser beam generated from said laser beam source.

13. An exposure method in which a mask is illuminated using a laser beam generated from a laser beam source and a pattern formed on said mask is transferred onto an object, wherein
as said laser beam, a laser beam generated from said laser beam source controlled by said laser beam source control method according to claim 1 is used.

14. A device manufacturing method that includes lithographic process, wherein
in said lithographic process, a device pattern formed on a mask is transferred onto an object using said exposure method according to claim 13.

15. A laser beam source control apparatus that controls a laser beam source that is applicable to an exposure apparatus exposing a substrate with an exposure beam while relatively scanning the substrate with respect to the exposure beam, and also generates a beam to be used as the exposure beam and whose oscillation frequency is variable, said apparatus comprising:
a storage unit that stores information including a relationship between an oscillation frequency of said laser beam source in a predetermined range including a usable oscillation frequency and an output quality of said laser beam source; and
a control unit that determines said oscillation frequency of said laser beam source based on said information stored in said storage unit, and controls an oscillation environment affecting factor that affects oscillation environment when oscillating said laser beam source based on the determined oscillation frequency, wherein
said information is information for judging whether said oscillation frequency of said laser beam source is appropriate or not while taking into consideration said output quality of said laser beam source, said oscillation frequency being calculated in accordance with an exposure pulse number and scanning velocity when said exposure apparatus performs scanning exposure.

16. The laser beam source control apparatus according to claim 15, wherein
said oscillation environment affecting factor includes said oscillation frequency of said laser beam source.

17. The laser beam source control apparatus according to claim 16, wherein
said storage unit stores information on a relationship between said oscillation frequency and said output quality of said laser beam source, and
said control unit controls said oscillation frequency of said laser beam source.

18. The laser beam source control apparatus according to claim 16, wherein
said storage unit stores information on a particular oscillation frequency range where said output quality deteriorates, and
said control unit sets said oscillation frequency of said laser beam source avoiding said particular oscillation frequency range.

19. The laser beam source control apparatus according to claim 16, wherein
said storage unit stores information on a particular oscillation frequency range where said output quality becomes the best, and
said control unit sets said oscillation frequency of said laser beam source to an oscillation frequency within said particular oscillation frequency range.

20. The laser beam source control apparatus according to claim 15, wherein
said storage unit stores information on a relationship between said oscillation frequency, said output quality, and a predetermined control factor other than said oscillation frequency related to oscillation of said laser beam source, and
said control unit controls said predetermined control factor as said oscillation environment affecting factor so as to change a relationship between said oscillation frequency and said output quality.

21. The laser beam source control apparatus according to claim 20, wherein
said control factor includes at least either one of flow velocity and temperature of gas inside said laser beam source.

22. The laser beam source control apparatus according to claim 21, wherein
said control unit changes said relationship between said oscillation frequency and said output quality so that an oscillation frequency range where said output quality deteriorates goes off from said oscillation frequency range to be used, by controlling said control factor.

23. The laser beam source control apparatus according to claim 21, wherein
said control unit changes said relationship between said oscillation frequency and said output quality so that an oscillation frequency range of said laser beam source whose said output quality is most stable matches a desired frequency, by controlling said control factor.

24. The laser beam source control apparatus according to claim 20, wherein
said control unit sets the oscillation frequency of said laser beam source to an oscillation frequency out of said oscillation frequency range where said output quality deteriorates, after controlling said predetermined control factor.

25. The laser beam source control apparatus according to claim 15, wherein
said output quality includes at least one of energy stability, wavelength stability, and variation characteristics of spectrum line width of laser beam generated from said laser beam source.

26. An exposure apparatus that uses a laser beam generated from a laser beam source to illuminate a mask to transfer a pattern formed on said mask onto an object, said exposure apparatus comprising:
said laser beam source control apparatus according to claim 15; and
a projection optical system that projects an image of a pattern on said mask illuminated by said laser beam that generated from said laser beam source controlled by said laser beam source control apparatus onto said object.

27. A laser beam source control method in which a laser beam source that performs pulse emission of laser beam and whose oscillation frequency is variable is controlled, said method comprising:
an obtaining process in which information including a relationship between an oscillation frequency of said laser beam source and an output quality of said laser beam source is obtained; and
a controlling process in which said oscillation frequency of said laser beam source is determined based on said information obtained in said obtaining process, and an oscillation environment affecting factor that affects an oscillation environment when oscillating said laser beam source is controlled, based on the determined oscillation frequency.

28. The laser beam source control method according to claim 27 wherein
said output quality includes at least one of energy stability, wavelength stability, and variation characteristics of spectrum line width of laser beam generated from said laser beam source.

29. The laser beam source control method according to claim 28, wherein
in said obtaining process, information on a particular oscillation frequency range where said output quality deteriorates is obtained as said information, and
in said controlling process, said oscillation frequency of said laser beam source is controlled as said oscillation environment affecting factor, and said oscillation frequency is set avoiding said particular oscillation frequency range.

30. The laser beam source control method according to claim 28, wherein
in said obtaining process, information on a relationship between said oscillation frequency, said output quality, and a predetermined control factor other than said oscillation frequency related to oscillation of said laser beam source is obtained as said information, and
in said controlling process, said predetermined control factor is controlled as said oscillation environment affecting factor so as to change a relationship between said oscillation frequency and said output quality.

31. The laser beam source control method according to claim 28, wherein
in said controlling process, said relationship between said oscillation frequency and said output quality is changed by controlling said control factor so that an oscillation frequency range where said output quality deteriorates goes off from said oscillation frequency range to be used.

32. The laser beam source control method according to claim 30, wherein
said control factor includes at least either one of flow velocity and temperature of gas inside said laser beam source.

33. The laser beam source control method according to claim 28, wherein said laser beam source is controlled so that said oscillation frequency of said laser beam source is variable also in a range of 1000 Hz or more.

34. A laser beam source control method in which a laser beam source that performs pulse emission of laser beam and whose oscillation frequency is variable is controlled, said method comprising:

an obtaining process in which information including a relationship between an oscillation frequency of said laser beam source and an output quality of said laser beam source is obtained;

a determining process in which said oscillation frequency is determined based on said information obtained in said obtaining process;

a supplying process in which said information on said oscillation frequency determined in said determining process is supplied to said laser beam source; and a controlling process in which an oscillation environment affecting factor that affects an oscillation environment when oscillating said laser beam source is controlled, based on the oscillation frequency supplied in said supplying process.

35. The laser beam source control method according to claim 34 wherein said output quality includes at least one of energy stability, wavelength stability, and variation characteristics of spectrum line width of laser beam generated from said laser beam source.

36. The laser beam source control method according to claim 35, wherein in said obtaining process, information on a particular oscillation frequency range where said output quality deteriorates is obtained as said information, and in said controlling process, said oscillation frequency of said laser beam source is controlled as said oscillation environment affecting factor, and said oscillation frequency is set avoiding said particular oscillation frequency range.

37. The laser beam source control method according to claim 35, wherein in said obtaining process, information on a relationship between said oscillation frequency, said output quality, and a predetermined control factor other than said oscillation frequency related to oscillation of said laser beam source is obtained as said information, and in said controlling process, said predetermined control factor is controlled as said oscillation environment affecting factor so as to change a relationship between said oscillation frequency and said output quality.

38. The laser beam source control method according to claim 35, wherein in said controlling process, said relationship between said oscillation frequency and said output quality is changed by controlling said control factor so that an oscillation frequency range where said output quality deteriorates goes off from said oscillation frequency range to be used.

39. The laser beam source control method according to claim 37, wherein said control factor includes at least either one of flow velocity and temperature of gas inside said laser beam source.

40. The laser beam source control method according to claim 35, wherein said laser beam source is controlled so that said oscillation frequency of said laser beam source is variable also in a range of 1000 Hz or more.

41. A laser beam source control apparatus that controls a laser beam source that performs pulse emission of laser beam and whose oscillation frequency is variable, said apparatus comprising:

a storage unit that stores information including a relationship between an oscillation frequency of said laser beam source and an output quality of said laser beam source; and a control unit that determines said oscillation frequency of said laser beam source based on said information stored in said storage unit, and controls an oscillation environment affecting factor that affects oscillation environment when oscillating said laser beam source based on the determined oscillation frequency.

42. The laser beam source control apparatus according to claim 41, wherein said control unit changes said relationship between said oscillation frequency and said output quality so that an oscillation frequency range where said output quality deteriorates goes off from said oscillation frequency range to be used, by controlling said control factor.

43. The laser beam source control apparatus according to claim 42, wherein said storage unit stores information on a relationship between said oscillation frequency and said output quality of said laser beam source, and said control unit controls said oscillation frequency of said laser beam source.

44. The laser beam source control apparatus according to claim 42, wherein said storage unit stores information on a particular oscillation frequency range where said output quality becomes the best, and said control unit sets said oscillation frequency of said laser beam source to an oscillation frequency within said particular oscillation frequency range.

45. The laser beam source control apparatus according to claim 44, wherein said storage unit stores information on a relationship between said oscillation frequency, said output quality, and a predetermined control factor other than said oscillation frequency related to oscillation of said laser beam source, and said control unit controls said predetermined control factor as said oscillation environment affecting factor so as to change a relationship between said oscillation frequency and said output quality.

46. The laser beam source control apparatus according to claim 42, wherein said laser beam source is controlled so that said oscillation frequency of said laser beam source is variable also in a range of 1000 Hz or more.

47. A laser beam source control apparatus that controls a laser beam source that performs pulse emission of laser beam and whose oscillation frequency is variable, said apparatus comprising:

a receiving section that receives information on oscillation frequency of said laser beam source determined based on information including a relationship between said oscillation frequency of said laser beam source and an output quality of said laser beam source; and a control unit that controls an oscillation environment affecting factor that affects an oscillation environment when oscillating said laser beam source, based on said information on oscillation frequency received by said receiving section.

48. The laser beam source control apparatus according to claim 47, wherein said control unit changes said relationship between said oscillation frequency and said output quality so that an oscillation frequency range where said output quality deteriorates goes off from said oscillation frequency range to be used, by controlling said control factor.

49. The laser beam source control apparatus according to claim 48, wherein said storage unit stores information on a relationship between said oscillation frequency and said output quality of said laser beam source, and said control unit controls said oscillation frequency of said laser beam source.

50. The laser beam source control apparatus according to claim 48, wherein said storage unit stores information on a particular oscillation frequency range where said output quality becomes the best, and said control unit sets said oscillation frequency of said laser beam source to an oscillation frequency within said particular oscillation frequency range.

51. The laser beam source control apparatus according to claim 50, wherein said storage unit stores information on a relationship between said oscillation frequency, said output quality, and a predetermined control factor other than said oscillation frequency related to oscillation of said laser beam source, and said control unit controls said predetermined control factor as said oscillation environment affecting factor so as to change a relationship between said oscillation frequency and said output quality.

52. The laser beam source control apparatus according to claim 48, wherein said laser beam source is controlled so that said oscillation frequency of said laser beam source is variable also in a range of 1000 Hz or more.

* * * * *